United States Patent
Li

(10) Patent No.: US 9,385,308 B2
(45) Date of Patent: Jul. 5, 2016

(54) PERPENDICULAR MAGNETIC TUNNEL JUNCTION STRUCTURE

(75) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 472 days.

(21) Appl. No.: 12/732,675

(22) Filed: Mar. 26, 2010

(65) Prior Publication Data

US 2011/0233696 A1    Sep. 29, 2011

(51) Int. Cl.
*H01L 43/12* (2006.01)
*G11C 11/56* (2006.01)
*G11C 11/16* (2006.01)

(52) U.S. Cl.
CPC ............... *H01L 43/12* (2013.01); *G11C 11/16* (2013.01); *G11C 11/5607* (2013.01)

(58) Field of Classification Search
None
See application file for complete search history.

(56) References Cited

U.S. PATENT DOCUMENTS

| | | | |
|---|---|---|---|
| 5,801,984 A | 9/1998 | Parkin | |
| 6,072,718 A | 6/2000 | Abraham et al. | |
| 6,166,948 A | 12/2000 | Parkin et al. | |
| 6,753,269 B1 * | 6/2004 | Li et al. | 438/778 |
| 6,794,697 B1 * | 9/2004 | Sharma | 257/295 |
| 6,841,820 B2 * | 1/2005 | Komuro et al. | 257/295 |
| 7,109,539 B2 | 9/2006 | Lu | |
| 7,579,197 B1 | 8/2009 | Li | |
| 7,902,878 B2 | 3/2011 | Saint-Laurent et al. | |
| 8,564,079 B2 | 10/2013 | Kang et al. | |
| 2003/0117247 A1 * | 6/2003 | Ruhrig | 335/306 |
| 2003/0117866 A1 * | 6/2003 | Tuttle | 365/200 |
| 2004/0052131 A1 * | 3/2004 | Komuro et al. | 365/202 |
| 2004/0252538 A1 * | 12/2004 | Parkin | 365/80 |
| 2005/0073879 A1 * | 4/2005 | Gogl et al. | 365/158 |
| 2005/0095855 A1 | 5/2005 | D'urso et al. | |
| 2006/0048091 A1 * | 3/2006 | Joshi et al. | 716/21 |
| 2006/0276034 A1 * | 12/2006 | Blanchard | 438/672 |
| 2007/0014149 A1 * | 1/2007 | Nagamine et al. | 365/158 |
| 2007/0075736 A1 * | 4/2007 | Goodnow et al. | 326/41 |
| 2007/0120210 A1 * | 5/2007 | Yuan et al. | 257/427 |
| 2007/0204086 A1 * | 8/2007 | Jaroszewski et al. | 710/262 |
| 2009/0073749 A1 * | 3/2009 | Dittrich et al. | 365/158 |
| 2009/0080239 A1 | 3/2009 | Nagase et al. | |

(Continued)

FOREIGN PATENT DOCUMENTS

| CN | 101399313 A | 4/2009 |
|---|---|---|
| EP | 2234269 A1 | 9/2010 |

(Continued)

OTHER PUBLICATIONS

International Search Report and Written Opinion—PCT/US2011/030016—ISA/EPO—Jun. 1, 2011.

(Continued)

*Primary Examiner* — Bilkis Jahan
*Assistant Examiner* — Kevin Quinto
(74) *Attorney, Agent, or Firm* — Donald D. Min; Paul Holdaway

(57) ABSTRACT

In a particular illustrative embodiment, a method of fabricating a semiconductor device is disclosed that includes forming a metal layer over a device substrate, forming a via in contact with the metal layer, and adding a dielectric layer above the via. The method further includes etching a portion of the dielectric layer to form a trench area, and depositing a perpendicular magnetic tunnel junction (MTJ) structure within the trench area.

44 Claims, 16 Drawing Sheets

(56) References Cited

U.S. PATENT DOCUMENTS

| | | |
|---|---|---|
| 2009/0154274 A1 | 6/2009 | Abu-Rahma et al. |
| 2009/0174015 A1* | 7/2009 | Gu et al. ................ 257/421 |
| 2009/0243009 A1* | 10/2009 | Li et al. ................ 257/422 |
| 2009/0261433 A1 | 10/2009 | Kang et al. |

FOREIGN PATENT DOCUMENTS

| | | |
|---|---|---|
| JP | 2005032878 A | 2/2005 |
| JP | 2005109263 A | 4/2005 |
| JP | 2008028362 A | 2/2008 |
| JP | 2008159612 A | 7/2008 |
| JP | 2008218514 A | 9/2008 |
| JP | 2009129491 A | 6/2009 |
| WO | 2009078201 A1 | 6/2009 |
| WO | 2009111197 A1 | 9/2009 |
| WO | 2009131890 A1 | 10/2009 |
| WO | 2009131944 A1 | 10/2009 |
| WO | WO2009120487 | 10/2009 |
| WO | 2009135226 A2 | 11/2009 |

OTHER PUBLICATIONS

Taiwan Search Report—TW100110463—TIPO—May 27, 2014.

* cited by examiner

PERPENDICULAR MAGNETIC TUNNEL JUNCTION STRUCTURE

I. FIELD

The present disclosure is generally related to a magnetic tunnel junction (MTJ) structure.

II. DESCRIPTION OF RELATED ART

In general, widespread adoption of portable computing devices and wireless communication devices has increased demand for high-density and low-power non-volatile memory. As process technologies have improved, it has become possible to fabricate magneto-resistive random access memory (MRAM) based on magnetic tunnel junction (MTJ) devices. Traditional spin torque tunnel (STT) junction devices are typically formed as flat stack structures. Such devices typically have two-dimensional magnetic tunnel junction (MTJ) cells with a single magnetic domain. An MTJ cell typically includes a bottom electrode, a reference layer formed from an anti-ferromagnetic material, a fixed or pinned layer that carries a magnetic moment fixed or pinned by the reference layer, a tunnel barrier layer (i.e., a tunneling oxide layer), a free layer (i.e., a ferromagnetic layer that carries a magnetic moment having a changeable orientation), a cap layer, and a top electrode. A direction of the magnetic moment of the free layer relative to a direction of a fixed magnetic moment carried by the fixed layer determines a data value represented by the MTJ cell.

Typically, the magnetic tunnel junction (MTJ) cell is formed by depositing multiple layers of material, by defining a pattern onto the layers, and by selectively removing portions of the layers according to the pattern. Conventional STT MTJ cells are magnetic moment in-plane and formed to maintain an aspect ratio of length to width that is greater than one in order to maintain a magnetic isotropic effect. Conventionally, the aspect ratio of the MTJ cells is maintained by controlling an accuracy of the MTJ pattern and by performing an MTJ photo and etch process. In a particular instance, a hard mask may be used to transfer and define the MTJ pattern accurately. However, the MTJ cell structure may experience erosion, which may result in an undesired slope, corner rounding, and undesired film loss. Such damage can impact a contact resistance of the MTJ structure and potentially even expose or damage the MTJ junction.

III. SUMMARY

In a particular illustrative embodiment, a method of fabricating a semiconductor device is disclosed. The method includes forming a metal layer over a device substrate. The method further includes forming a via in contact with the metal layer and adding a dielectric layer above the via. The method also includes etching a portion of the dielectric layer to form a trench area. The method further includes depositing a perpendicular magnetic tunnel junction (MTJ) structure into the trench area.

In another particular embodiment, a semiconductor device is disclosed that includes a perpendicular magnetic tunnel junction (MTJ) structure disposed within a trench region of the semiconductor device.

One particular advantage provided by at least some of the disclosed embodiments is that oxidation, erosion and corner rounding can be reduced by using a trench to define dimensions of the perpendicular MTJ structure without photo/etching the perpendicular MTJ structure. The trench may be formed in an oxide base substrate, which is easier to photo-etch than the perpendicular MTJ metal films. Further, it is easier to precisely photo-etch the oxide base substrate than the metal layers. A reverse trench photo-etch process and a Chemical-Mechanical Planarization (CMP) process can be used to remove excess material, without introducing erosion, corner rounding or other issues that may impact performance of the perpendicular MTJ structure.

Another particular advantage is provided in that a process window for formation of perpendicular MTJ structures is improved, i.e., enlarged, and the overall reliability of perpendicular MTJ processes and resulting perpendicular MTJ structures is also improved.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
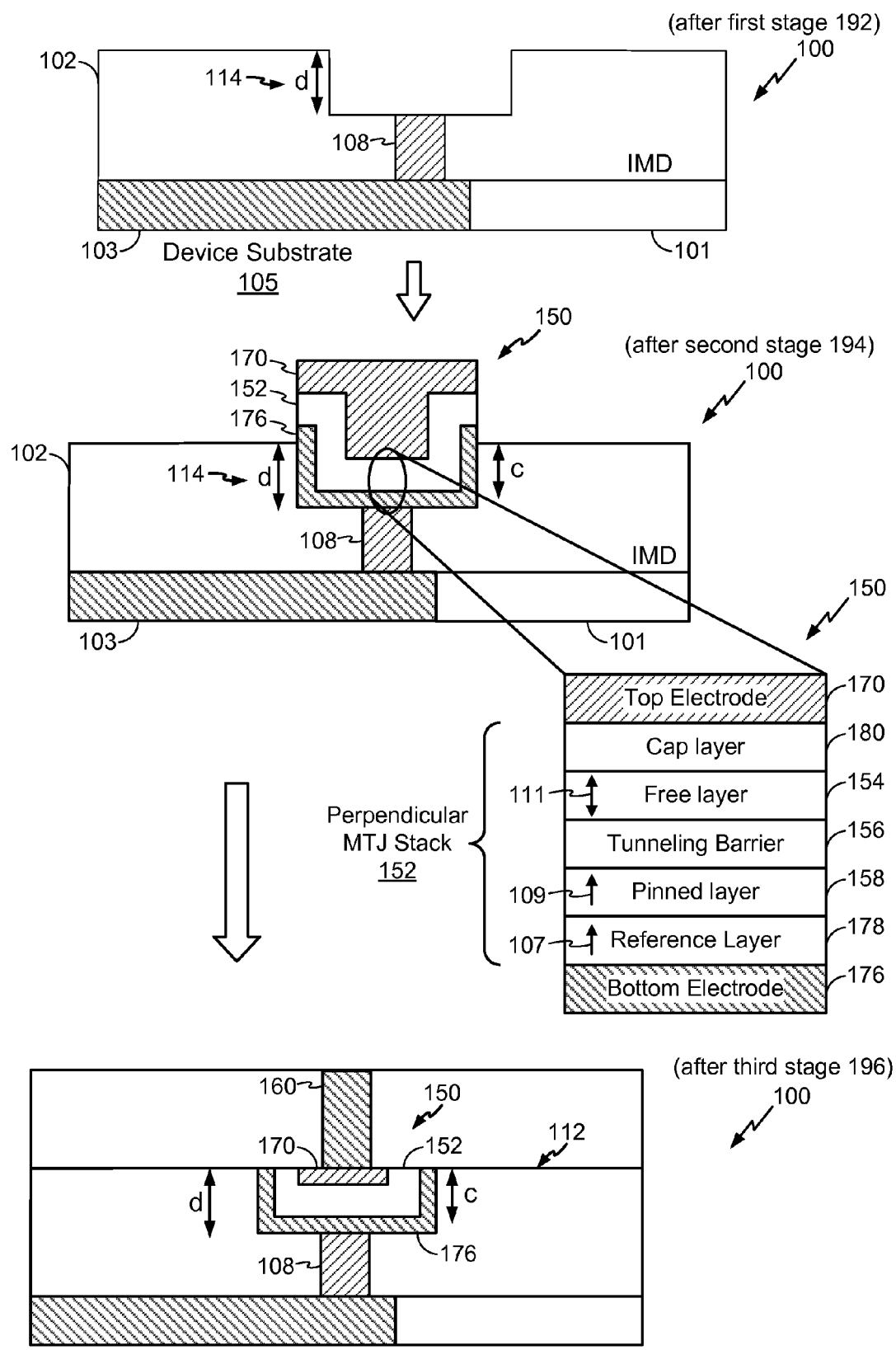
FIG. 1 is a cross-sectional view showing formation of a trench in a device and depicting a representative embodiment of a perpendicular magnetic tunnel junction (MTJ) disposed within the trench.

FIG. 1 is a cross-sectional view showing formation of a trench in a device and a representative embodiment of a perpendicular magnetic tunnel junction (MTJ) cell disposed within the trench. Referring to FIG. 1, a cross-sectional view of a particular embodiment of a circuit substrate after a first stage 192, a second stage 194, and a third stage 196 of processing is illustrated. The circuit substrate 100 includes a device substrate 105, a first inter-metal dielectric layer (IMD) 101, a wire trace 103, and a second inter-metal dielectric layer (IMD) 102 disposed over the first inter-metal dielectric layer (IMD) 101. In a particular embodiment, a photo-resistive layer may be applied by spinning photo-resist over the second IMD 102. A photo-etching process may be applied to define a trench pattern in the second inter-metal dielectric layer 102. The photo-resistive layer is stripped after etching to expose an opening or via through the second inter-metal dielectric layer 102. A conductive material or via fill material 108 is deposited into the opening, and a planarization process such as a CMP process may be performed to planarize the circuit substrate 100. A trench 114 is defined within the second inter-metal dielectric layer 102, for example by performing a trench photo-etch and cleaning process.

After the first stage 192, a perpendicular magnetic tunnel junction (MTJ) cell 150 is deposited within the trench 114. The perpendicular MTJ cell 150 includes a bottom electrode 176 that is coupled to the bottom via fill material 108, a perpendicular MTJ stack 152 coupled to the bottom electrode 176, and a top electrode 170 coupled to the perpendicular MTJ stack 152. A photo-resist layer may be patterned on the top electrode 170. A reverse MTJ photo-etching process is applied to the photo resist layer, the top electrode 170, the perpendicular MTJ stack 152, and the bottom electrode 176 to remove excess material that is not within or above the trench 114.

In this particular example, the trench 114 is defined to have a trench depth (d). The thickness of the bottom electrode 176 is defined to have a relative perpendicular MTJ cell depth (c). In a particular example, the perpendicular MTJ cell depth (c) is approximately equal to the trench depth (d) minus the thickness of the bottom electrode 176.

In general, by fabricating the perpendicular MTJ cell 150 within the trench 114, the dimensions of the trench 114 define the dimensions of the perpendicular MTJ cell 150. Further, because the trench 114 defines the dimensions of the perpendicular MTJ cell 150, the perpendicular MTJ cell 150 can be formed without performing a critical and expensive photo-etch process on the perpendicular MTJ cell 150, thereby reducing oxidation, corner rounding and other erosion-related issues with respect to the perpendicular MTJ cell 150.

In a particular embodiment, the perpendicular MTJ cell 150 includes a perpendicular MTJ stack 152 including a free layer 154, a tunnel barrier layer 156, and a pinned layer 158. The free layer 154 of the perpendicular MTJ stack 152 is coupled to the top electrode 170 via a cap layer 180. In this example, the pinned layer 158 of the perpendicular MTJ stack 152 is coupled to the bottom electrode 176 via a reference layer 178. In a particular embodiment, the reference layer 178 may comprise platinum.

The reference layer 178 and pinned layer 158 have respective magnetic domains 107 and 109 that are oriented in the same direction. The free layer 154 includes a magnetic domain 111 that is programmable via a write current (not shown). In this particular view, the magnetic domains 107, 109, and 111 are oriented vertically. In other embodiments, additional layers may be included, such as one or more seed layers; buffer layers; stray field balance layers; connection layers; performance enhancement layers, such as synthetic pinned layers, synthetic free (SyF) layers, or dual spin filter (DSF); or any combination thereof. In a particular embodiment, the perpendicular MTJ cell 150 may comprise iron/platinum. In another particular embodiment, the perpendicular MTJ cell may comprise cobalt/platinum. In yet another particular embodiment, the perpendicular MTJ cell may comprise cobalt/nickel.

After the bottom electrode 176, the perpendicular MTJ stack 152, and the top electrode 170 are formed within the trench 114, in the third stage 196, a Chemical-Mechanical Planarization (CMP) process is applied to form a substantially planar surface 112. A third cap layer and a fourth inter-metal dielectric layer may be deposited. A photo-etch process is applied to define a via 160. The via 160 is filled with conductive material and a planarization process such as a via Chemical-Mechanical Planarization process may be applied.

Figure 8:
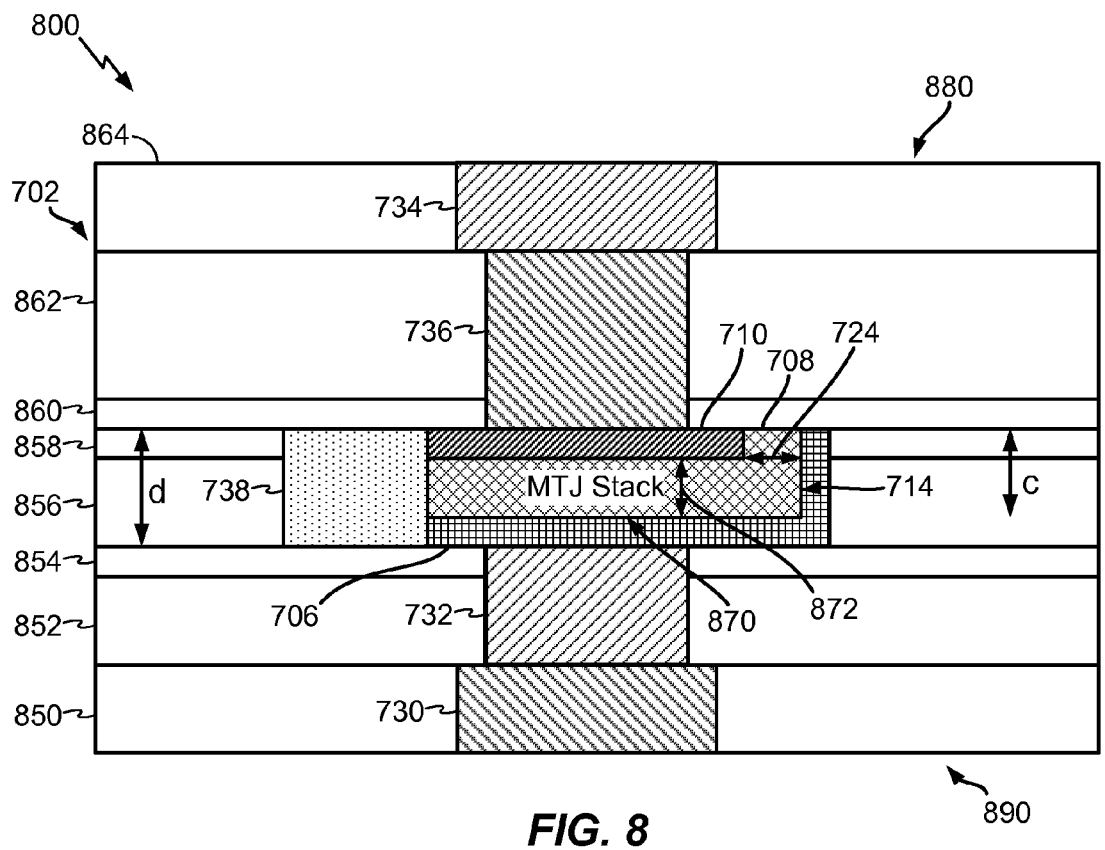
FIG. 8 is a cross-sectional diagram of the circuit device of FIG. 7 taken along line 8-8 in FIG. 7.

In a particular embodiment, the perpendicular MTJ stack may take the form of the trench 114. For example, in a particular embodiment depicted in FIG. 2, the perpendicular MTJ stack may have a substantially rectangular shape and the trench region may have a substantially rectangular shape. In another particular embodiment depicted in FIG. 3, the perpendicular MTJ stack may have a substantially U-shaped cross section and the trench region may have a substantially U-shaped cross section. In yet another particular embodiment as depicted in FIG. 8, the perpendicular MTJ stack may have a substantially L-shaped cross section and the trench region may have a substantially L-shaped cross section. In still another particular embodiment as depicted in FIG. 4, at least a portion of the trench may have a substantially curved shape. In a particular embodiment, the shape of the perpendicular MTJ stack may be defined by the trench without etching the MTJ stack.

A perpendicular STT MTJ formed within a trench may provide benefits as compared to in-plane STT MTJs. For example, an in-plane STT MTJ has a higher damping factor which causes higher switching current. The MTJ switching current also correlates with an energy barrier and a coercivity field of the MTJ which limits MTJ bit cell switching current reduction. As a result, in-plane MRAM bit cell size reduction is also limited. For a perpendicular STT MTJ, however, the energy barrier switch current has substantially no correlation with the coercivity field, and damping is also reduced. As such, the energy barrier switch current can be scaled without considering the coercivity field. The perpendicular STT MTJ shape aspect ratio and isotropic requirements are also reduced compared to in-plane STT MTJ. As a result, the MRAM bit cell size can be reduced. Detrimental performance effects that may limit perpendicular MTJ scaling, such as due to erosion or corner rounding may be reduced or avoided by forming the perpendicular MTJ within the trench.

Figure 2:
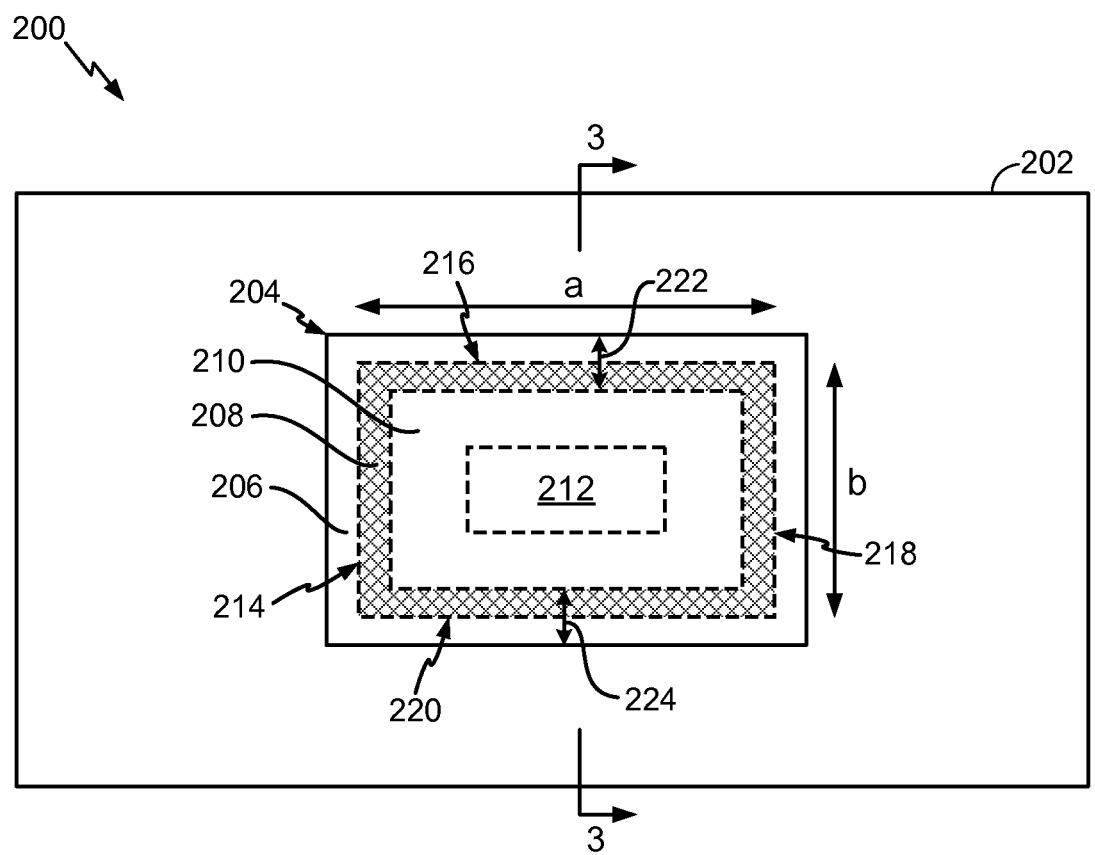
FIG. 2 is a top view of a particular illustrative embodiment of a circuit device including a perpendicular magnetic tunnel junction (MTJ) cell having a substantially rectangular shape.

FIG. 2 is a top view of a particular illustrative embodiment of a circuit device 200 including a perpendicular magnetic tunnel junction (MTJ) cell 204 having a substantially rectangular shape. The circuit device 200 includes a substrate 202 that has the perpendicular MTJ cell 204. The perpendicular MTJ cell 204 includes a bottom electrode 206, a perpendicular MTJ stack 208, a center electrode 210, and a via 212. The perpendicular MTJ cell 204 has a first sidewall 214, a second sidewall 216, a third sidewall 218, and a fourth sidewall 220. The second sidewall 216 includes a second magnetic domain 222 to represent a first data value and the fourth sidewall 220 includes a fourth magnetic domain 224 to represent a second data value. A bottom wall (not shown) may include a bottom magnetic domain 346 (see FIG. 3) to represent another data value. The first and third sidewalls 214 and 218 may also carry magnetic domains depending on a particular implementation.

The perpendicular MTJ cell 204 has a length (a) and a width (b). The length (a) corresponds to the length of the second and fourth sidewalls 216 and 220. The width (b) corresponds to the length of the first and third sidewalls 214 and 218. In this particular example, the length (a) of the perpendicular MTJ cell 204 is greater than the width (b). Alternatively, the length (a) of the perpendicular MTJ cell 204 can be equal to the width (b).

Figure 3:
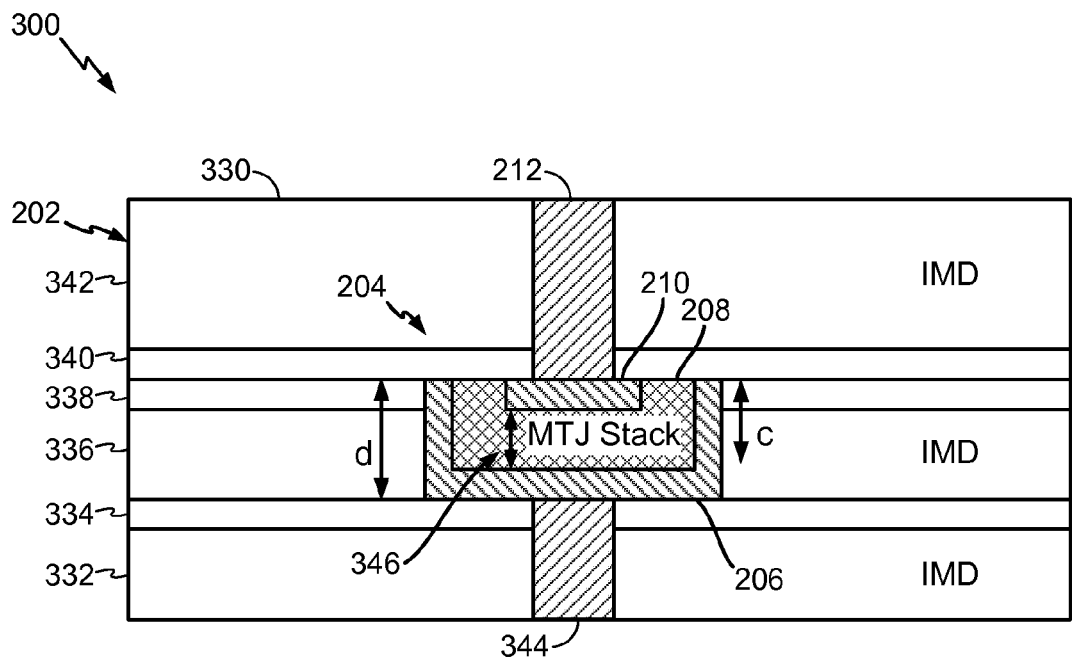
FIG. 3 is a cross-sectional view of the circuit device of FIG. 2 taken along line 3-3 in FIG. 2.
Figure 4:
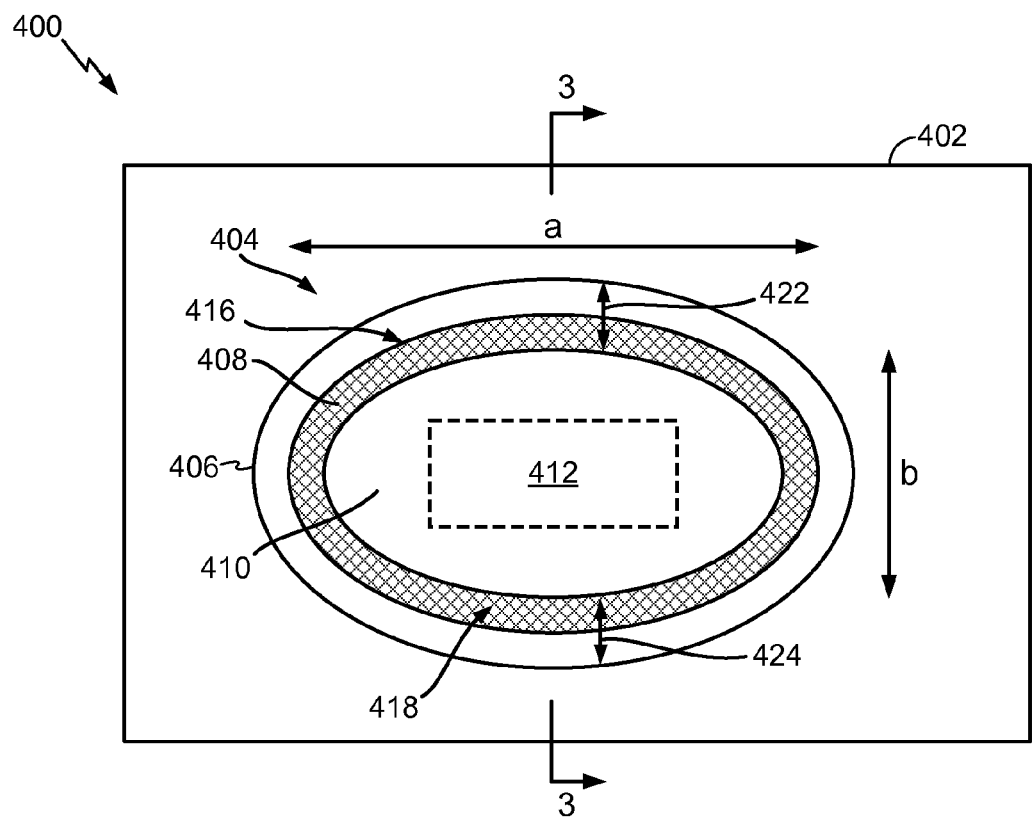
FIG. 4 is a top view of a second particular illustrative embodiment of a circuit device including a perpendicular magnetic tunnel junction (MTJ) having a substantially elliptical shape.

FIG. 3 is a cross-sectional view 300 of the circuit device 200 of FIG. 2 taken along line 3-3 in FIG. 2. The view 300 includes the substrate 202 shown in cross-section including the perpendicular MTJ cell 204, the via 212, the top electrode 210, the perpendicular MTJ stack 208, and the bottom electrode 206. The substrate 202 includes a first inter-metal dielectric layer 332, a first cap layer 334, a second inter-metal dielectric layer 336, a second cap layer 338, a third cap layer 340, and a third inter-metal dielectric layer 342.

A trench is formed in the second cap layer 338 and the second inter-metal dielectric layer 336 to receive the bottom electrode 206, the perpendicular MTJ stack 208, and the top electrode 210. The trench has a trench depth (d) and the perpendicular MTJ stack 208 has a depth (c) that is approximately equal to the trench depth (d) minus a thickness of the bottom electrode 206. A bottom via 344 extends through the first cap layer 334 and the first inter-metal dielectric layer 332 and is coupled to the bottom electrode 206. The via 212 extends from a surface 330 of the substrate 202 through the third inter-metal dielectric layer 342 and the third cap layer 340 and is coupled to the top electrode 210. The surface 330 may be a substantially planar surface.

FIG. 4 is a top view of a second particular illustrative embodiment of a circuit device 400 including a perpendicular magnetic tunnel junction (MTJ) cell 404 having a substantially elliptical shape. Alternatively, the perpendicular MTJ cell may have a round shape. The circuit device 400 includes a substrate 402 having the perpendicular MTJ cell 404. The perpendicular MTJ cell 404 includes a bottom electrode 406, a perpendicular MTJ stack 408, a top electrode 410, and a via 412 that extends from a surface (such as the surface 330 illustrated in FIG. 3) to the top electrode 410. The perpendicular MTJ cell 404 includes a first sidewall 416 and a second sidewall 418 that are adapted to carry independent magnetic domains 422 and 424, respectively. A respective orientation of each of the independent magnetic domains 422 and 424 may represent a respective data value. In addition, the perpendicular MTJ cell 404 may include a bottom wall adapted to carry another independent magnetic domain, such as the bottom domain 346 of FIG. 3, which may represent another data value.

The perpendicular MTJ cell 404 includes a length (a) and a width (b), where the length (a) is greater than the width (b). Alternatively, the length (a) may be equal to the width (b). In a particular embodiment, the cross-sectional view of FIG. 3 may also represent a cross-section taken along lines 3-3 in FIG. 4. In this example, the perpendicular MTJ cell 404 may be formed within a trench having a depth (d) such that the perpendicular MTJ cell 404 has a depth (c), as illustrated in FIG. 3. In this particular example, the perpendicular MTJ cell 404 may be formed such that the length (a) is greater than the width (b) and the width (b) is greater than the trench depth (d) or the perpendicular MTJ cell depth (c). Alternatively, the perpendicular MTJ cell 404 may be formed such that the MJT cell 404 has a trench depth (d) that is greater than the perpendicular MTJ cell depth (c), which in turn is greater than the length (a), as illustrated in FIGS. 5 and 6.

Figure 5:
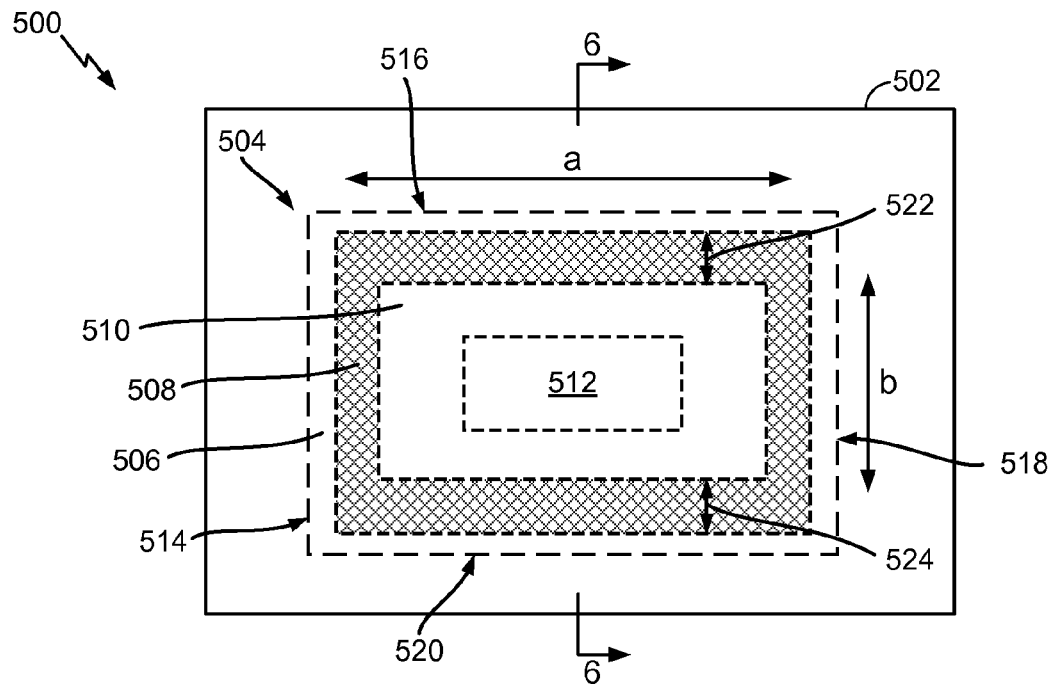
FIG. 5 is a top view of a third particular illustrative embodiment of a circuit device including a perpendicular magnetic tunnel junction (MTJ)

FIG. 5 is a top view of a third particular illustrative embodiment of a circuit device 500 including a perpendicular magnetic tunnel junction (MTJ) cell 504. The circuit device 500 includes a substrate 502 that has the perpendicular MTJ cell 504. The perpendicular MTJ cell 504 includes a bottom electrode 506, a perpendicular MTJ stack 508, a center electrode 510 and a via 512. The perpendicular MTJ cell 504 has a first sidewall 514, a second sidewall 516, a third sidewall 518, and a fourth sidewall 520. The second sidewall 516 includes a second magnetic domain 522 adapted to represent a first data value and the fourth sidewall 520 includes a fourth magnetic domain 524 adapted to represent a second data value. A bottom wall 670 may include a bottom magnetic domain 672, as depicted in FIG. 6. The first and third sidewalls 514 and 518 may also carry magnetic domains, depending on the particular implementation.

The perpendicular MTJ cell 504 has a length (a) and a width (b). The length (a) corresponds to the length of the second and fourth sidewalls 516 and 520. The width (b) corresponds to the length of the first and third sidewalls 514 and 518. In this particular example, the length (a) of the perpendicular MTJ cell 504 is greater than the width (b). Alternatively, the length (a) of the perpendicular MTJ cell 504 may be equal to the width (b).

Figure 6:
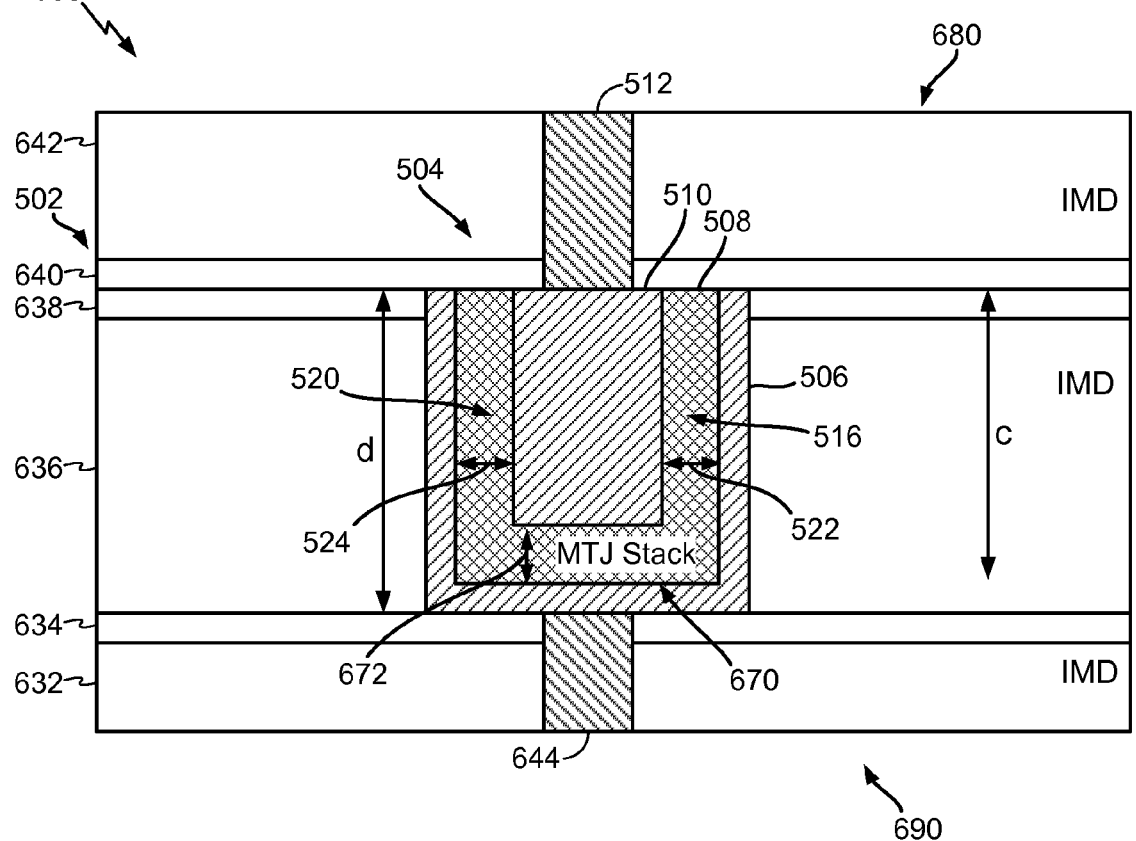
FIG. 6 is a cross-sectional view of the circuit device of FIG. 5 taken along line 6-6 in FIG. 5.

FIG. 6 is a cross-sectional view of the circuit device of FIG. 5 taken along line 6-6 in FIG. 5. The view 600 includes the substrate 502 shown in cross-section including the perpendicular MTJ cell 504, the via 512, the top electrode 510, the perpendicular MTJ stack 508, and the bottom electrode 506. The substrate 502 includes a first inter-metal dielectric layer 632, a first cap layer 634, a second inter-metal dielectric layer 636, a second cap layer 638, a third cap layer 640, and a third inter-metal dielectric layer 642.

A trench is formed in the second cap layer 638 and the second inter-metal dielectric layer 636 to receive the bottom electrode 506, the perpendicular MTJ stack 508, and the top electrode 510. The trench has a trench depth (d) and the perpendicular MTJ stack 508 has a depth (c) that is approximately equal to the trench depth (d) minus a thickness of the bottom electrode 506. A bottom via 644 extends from a bottom surface 690 through the first cap layer 634 and the first inter-metal dielectric layer 632 and is coupled to the bottom electrode 506. The via 512 extends from a top surface 680 of the substrate 502 through the third inter-metal dielectric layer 642 and the third cap layer 640 and is coupled to the top electrode 510. The top surface 680 may be a substantially planar surface.

In a particular embodiment, the trench depth (d) is greater than the perpendicular MTJ cell depth (c), which are both greater than the length (a) of the perpendicular MTJ cell 504. In this particular example, the magnetic domains 522 and 524 extend in a direction that is substantially parallel to the top surface 680 of the substrate 502 and that is oriented vertical to sidewall (i.e., as opposed to vertically in a direction of the depth (d) of the sidewalls).

Figure 7:
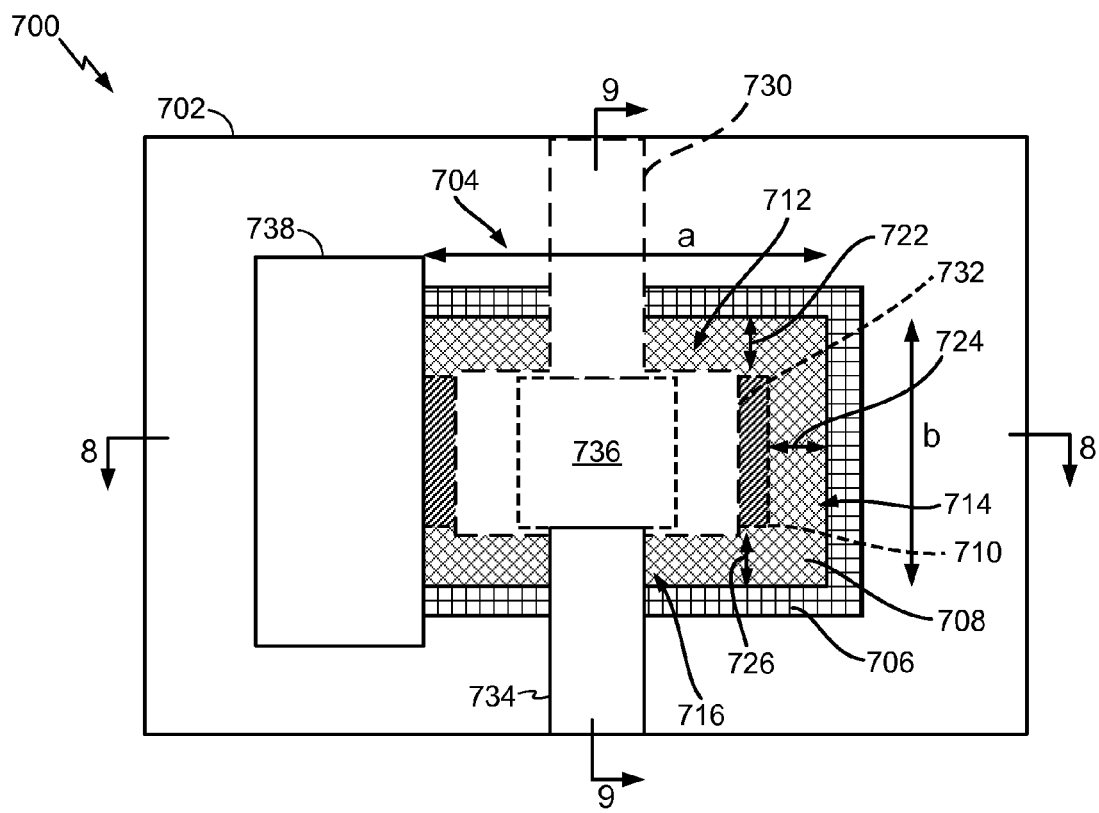
FIG. 7 is a top view of a particular illustrative embodiment of a memory device including a substrate having a perpendicular magnetic tunnel junction cell that is adapted to store multiple bits.

FIG. 7 is a top view of a particular illustrative embodiment of a memory device 700 including a substrate 702 having a perpendicular magnetic tunnel junction (MTJ) cell 704 that may be adapted to store multiple data bits. The perpendicular magnetic tunnel junction (MTJ) cell 704 includes a bottom electrode 706, a perpendicular MTJ stack 708, and a center electrode 710. The perpendicular MTJ cell 704 has a length (a) and a width (b), where the length (a) is greater than or equal to the width (b). The substrate 702 includes a top via 736 that is coupled to the center electrode 710 and includes a bottom via 732 that is coupled to the bottom electrode 706. The substrate 702 also includes a first wire trace 734 that is coupled to the top via 736 and a second wire trace 730 that is coupled to the bottom via 732. The substrate 702 includes a process opening 738. The process opening 738 is an optional step to remove one sidewall of MTJ.

The perpendicular MTJ stack 708 includes a pinned (fixed) magnetic layer that carries a fixed magnetic domain having a fixed orientation, a tunnel barrier layer, and a free magnetic layer having a magnetic domain that can be changed or programmed via a write current. The perpendicular MTJ stack 708 may also include a reference layer to pin the fixed magnetic layer. In a particular embodiment, the fixed magnetic layer of the perpendicular MTJ stack 708 may include one or more layers. Additionally, the perpendicular MTJ stack 708 may include other layers. The perpendicular MTJ cell 704 includes a first sidewall 712 to carry a first magnetic domain 722, a second sidewall 714 to carry a second magnetic domain 724, and a third sidewall 716 to carry a third magnetic domain 726. The perpendicular MTJ cell 704 also includes a bottom wall 870 to carry fourth magnetic domain 872 (see FIG. 8). The first, second, third, and fourth magnetic domains 722, 724, 726, and 872 are independent. In a particular embodiment, the first, second, third, and fourth magnetic domains 722, 724, 726, and 872 are configured to represent respective data values. In general, the orientations of the magnetic domains 722, 724, 726, and 872 are determined by the stored data value. For example, a "0" value may be represented by a first orientation while a "1" value may be represented by a second orientation.

FIG. 8 is a cross-sectional diagram 800 of the circuit device 700 of FIG. 7 taken along line 8-8 in FIG. 7. The diagram 800 includes the substrate 702 having a first inter-metal dielectric layer 850, a second inter-metal dielectric layer 852, a first cap layer 854, a third inter-metal dielectric layer 856, a second cap layer 858, a third cap layer 860, a fourth inter-metal dielectric layer 862, and a fifth inter-metal dielectric layer 864. The substrate 702 has a first surface 880 and a second surface 890. The substrate 702 also includes the perpendicular MTJ structure 704 including the perpendicular MTJ stack 708. The bottom electrode 706, the perpendicular MTJ stack 708, and the top electrode 710 are disposed within a trench in the substrate 702. The trench has a depth (d).

The substrate 702 includes the second wire trace 730 disposed at the second surface 890. The second wire trace 730 is coupled to the bottom via 732, which extends from the second wire trace 730 to a portion of the bottom electrode 706. The substrate 702 also includes the first wire trace 734 disposed at the first surface 880. The first wire trace 734 is coupled to the top via 736, which extends from the first wire trace 734 to the center electrode 710. The center electrode 710 is coupled to the perpendicular MTJ stack 708. The substrate 702 also includes the process opening 738, which may be formed by selectively removing a portion of the perpendicular MTJ structure 704 and depositing an inter-metal dielectric material within the processing opening 738, followed by a Chemical-Mechanical Planarization (CMP) process.

In a particular embodiment, the perpendicular MTJ stack 708 includes the second sidewall 714, which carries the second magnetic domain 724. The second magnetic domain 724 may be adapted to represent a second data value. The perpendicular MTJ stack 708 also includes a bottom wall 870 having a bottom magnetic domain 872, which may be adapted to represent a fourth data value. In a particular example, a data value can be read from the perpendicular MTJ stack 708 by applying a voltage to the first wire trace 734 and by comparing a current at the second wire trace 730 to a reference current. Alternatively, a data value may be written to the perpendicular MTJ stack 708 by applying a write current to one of the first and second wire traces 734 and 730. In a particular embodiment, the length (a) and the width (b) of the perpendicular MTJ stack 708 illustrated in FIG. 7 are greater than the trench depth (d), and the magnetic domain 724 carried by the second sidewall 714 extends in a direction that is substantially parallel to the first surface 880 of the substrate 702 and that is oriented horizontally (i.e., in a direction of the length (a) of the sidewalls, as opposed to vertically in a direction of the depth (d) of the sidewalls).

Figure 9:
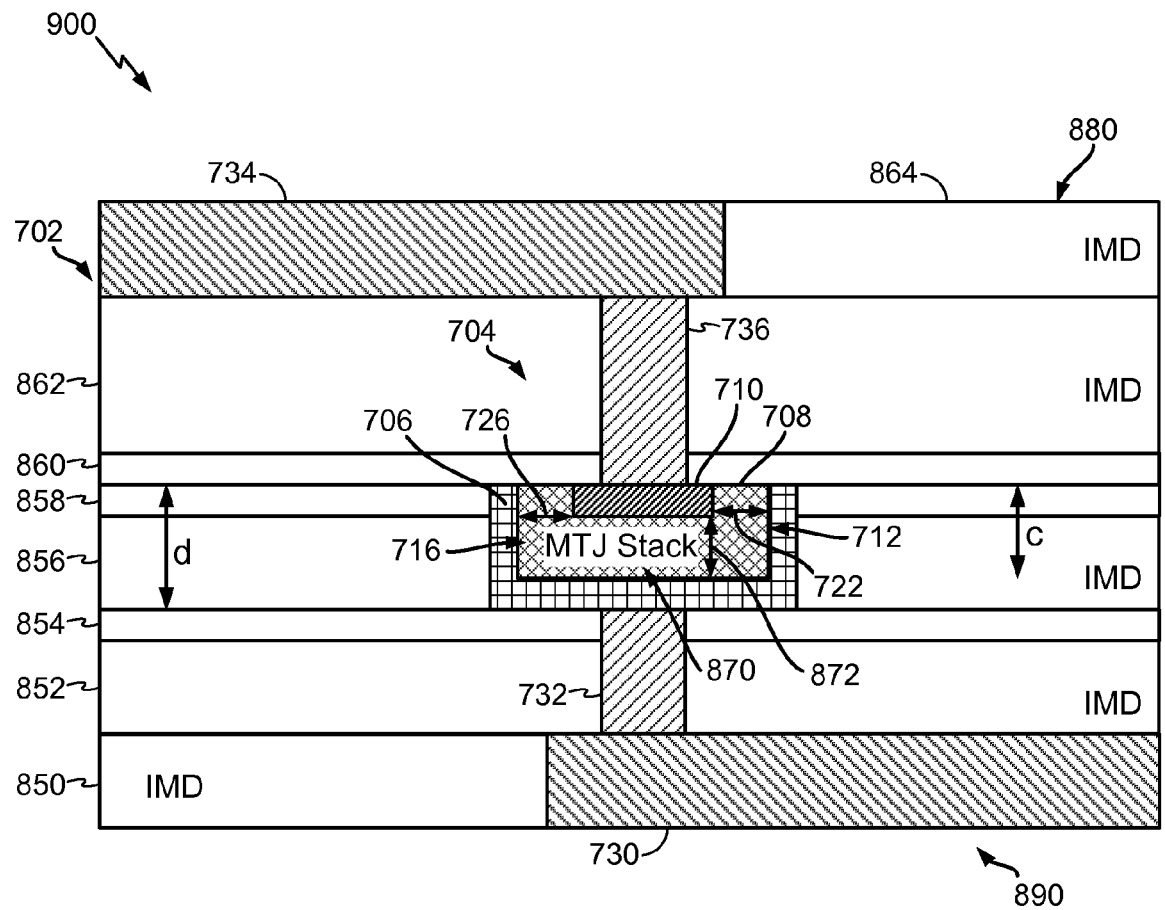
FIG. 9 is a cross-sectional diagram of the circuit device of FIG. 7 taken along line 9-9 in FIG. 7.

FIG. 9 is a cross-sectional diagram 900 of the circuit device 700 of FIG. 7 taken along line 9-9 in FIG. 7. The diagram 900 includes the substrate 702 having a first inter-metal dielectric layer 850, a second inter-metal dielectric layer 852, a first cap layer 854, a third inter-metal dielectric layer 856, a second cap layer 858, a third cap layer 860, a fourth inter-metal dielectric layer 862, and a fifth inter-metal dielectric layer 864. The substrate 702 has a first surface 880 and a second surface 890. The substrate 702 includes the perpendicular MTJ structure 704 having the bottom electrode 706, the perpendicular MTJ stack 708, and the center electrode 710. The substrate 702 includes the first wire trace 734 disposed and patterned at the first surface 880. The first wire trace 734 is coupled to the top via 736, which extends from the first wire trace 734 to the center electrode 710. The substrate 702 also includes the second wire trace 730 at the second surface 890. The second wire trace 730 is coupled to the bottom via 732, which extends from the second wire trace 730 to a portion of the bottom electrode 706. The perpendicular MTJ stack 708 includes the first sidewall 716 to carry the first magnetic domain 726, the third sidewall 712 to carry the third magnetic domain 722, and the bottom wall 870 to carry a bottom magnetic domain 872. In this particular view, the magnetic domains 726 and 722 are oriented horizontally (i.e., in a direction of the length (a) of the sidewalls, as opposed to vertically in a direction of the depth (d) of the sidewalls), and the bottom magnetic domain 872 is oriented vertically (i.e., in a direction of the depth (d) of the sidewalls, as opposed to horizontally in a direction of the length (a) of the sidewalls).

In a particular embodiment, the perpendicular MTJ stack 708 may be adapted to store up to four unique data values. A first data value may be represented by the first magnetic domain 722, a second data value may be represented by the second magnetic domain 724, a third data value may be represented by the third magnetic domain 726, and a fourth data value may be represented by the bottom magnetic domain 872. In another particular embodiment, a fourth sidewall may be included to carry a fourth magnetic domain, which may represent a fifth data value.

Figure 10:
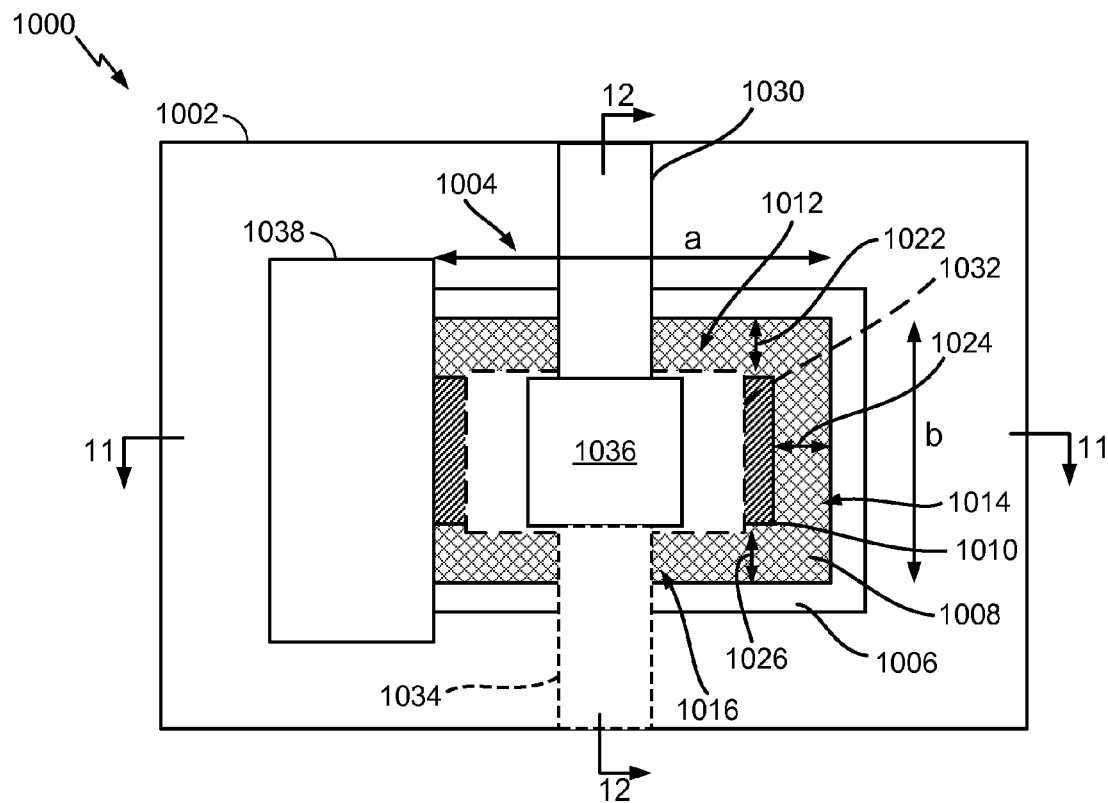
FIG. 10 is a top view of another particular illustrative embodiment of a memory device including a substrate having a perpendicular magnetic tunnel junction (MTJ) that is adapted to store multiple bits.

FIG. 10 is a top view of a particular illustrative embodiment of a memory device 1000 including a substrate 1002 with a perpendicular magnetic tunnel junction (MTJ) cell 1004 in a deep trench that may be adapted to store multiple data values, such as multiple bits. The perpendicular magnetic tunnel junction (MTJ) cell 1004 includes a bottom electrode 1006, a perpendicular MTJ stack 1008, and a center electrode 1010. The perpendicular MTJ cell 1004 has a length (a) and a width (b), where the length (a) is greater than or equal to the width (b). The substrate 1002 includes a top via 1036 that is coupled to the center electrode 1010 and includes a bottom via 1032 that is coupled to the bottom electrode 1006. The substrate 1002 also includes a first wire trace 1034 that is coupled to the bottom via 1032 and a second wire trace 1030 that is coupled to the top via 1036. The substrate 1002 includes a process opening 1038.

The perpendicular MTJ stack 1008 includes a pinned (fixed) magnetic layer that may be pinned by a reference layer and that carries a fixed magnetic domain having a fixed orientation, a tunnel barrier layer, and a free magnetic layer having a magnetic domain that can be changed or programmed via a write current. In a particular embodiment, the fixed magnetic layer of the perpendicular MTJ stack 1008 may include one or more layers. Additionally, the perpendicular MTJ stack 1008 may include other layers. The perpendicular MTJ cell 1004 includes a first sidewall 1012 to carry a first magnetic domain 1022, a second sidewall 1014 to carry a second magnetic domain 1024, and a third sidewall 1016 to carry a third magnetic domain 1026. The perpendicular MTJ cell 1004 may also include a bottom wall 1170 to carry a fourth magnetic domain 1172 (see FIG. 11). The first, second, third, and fourth magnetic domains 1022, 1024, 1026, and 1172 are independent. In a particular embodiment, the first, second, third, and fourth magnetic domains 1022, 1024, 1026, and 1172 are configured to represent respective data values. In general, the orientations of the magnetic domains 1022, 1024, 1026, and 1172 are determined by the stored data value. For example, a "0" value may be represented by a first orientation while a "1" value may be represented by a second orientation.

Figure 11:
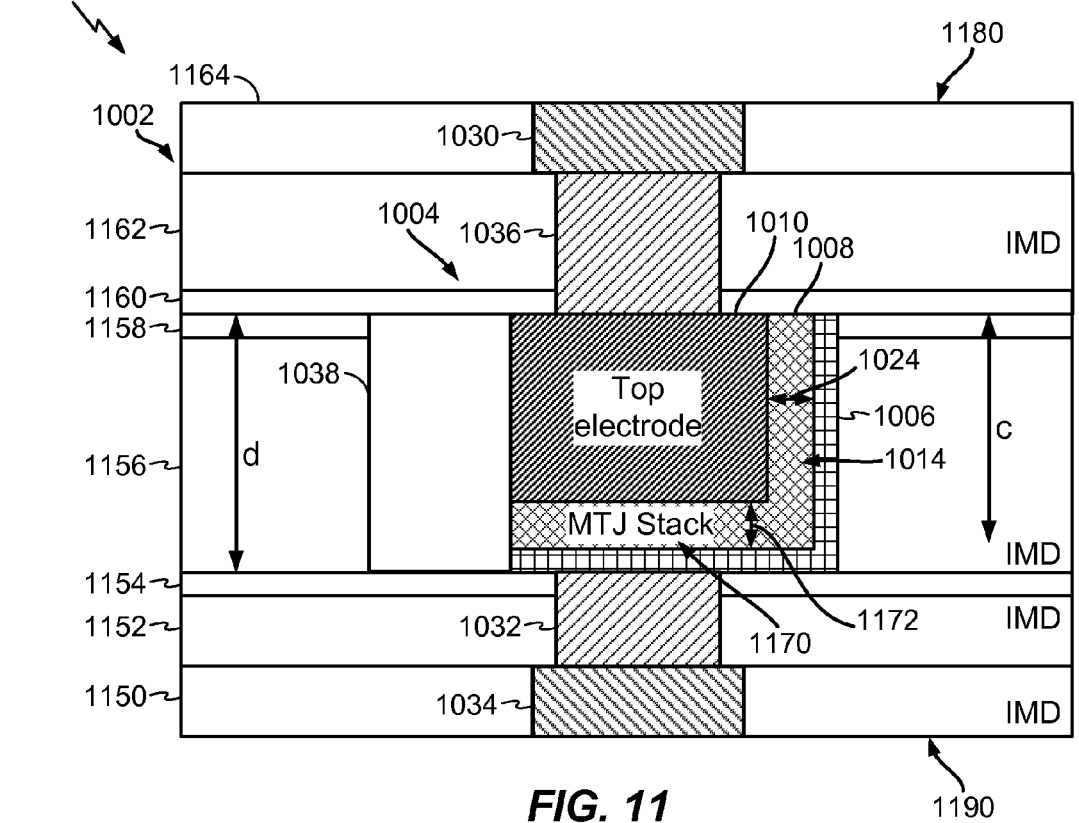
FIG. 11 is a cross-sectional diagram of the memory device of FIG. 10 taken along line 11-11 in FIG. 10.

FIG. 11 is a cross-sectional diagram 1100 of the circuit device 1000 of FIG. 10 taken along line 11-11 in FIG. 10. The diagram 1100 includes the substrate 1002 having a first inter-metal dielectric layer 1150, a second inter-metal dielectric layer 1152, a first cap layer 1154, a third inter-metal dielectric layer 1156, a second cap layer 1158, a third cap layer 1160, a fourth inter-metal dielectric layer 1162, and a fifth inter-metal dielectric layer 1164. The substrate 1002 has a first surface 1180 and a second surface 1190. The substrate 1002 also includes the perpendicular MTJ structure 1004 including the perpendicular MTJ stack 1008. The bottom electrode 1006, the perpendicular MTJ stack 1008, and the top electrode 1010 are disposed within a trench in the substrate 1002. The trench has a depth (d). In this instance, the depth (d) is greater than the width (b) of the sidewall 1014.

The substrate 1002 includes the second wire trace 1030 disposed and patterned at the first surface 1180. The second wire trace 1030 is coupled to the top via 1036, which extends from the second wire trace 1030 to the center electrode 1010. The center electrode 1010 is coupled to the perpendicular MTJ stack 1008. The substrate 1002 also includes the first wire trace 1034 disposed at the second surface 1190. The first wire trace 1034 is coupled to the bottom via 1032, which extends from the first wire trace 1034 to a portion of the bottom electrode 1006. The substrate 1002 further includes the process opening 1038, which may be formed by selectively removing a portion of the perpendicular MTJ stack 1008 and by depositing an inter-metal dielectric material within the processing opening 1038, followed by a Chemical-Mechanical Planarization (CMP) process.

In a particular embodiment, the perpendicular MTJ stack 1008 includes the second sidewall 1014, which carries the second magnetic domain 1024. The second magnetic domain 1024 may be adapted to represent a second data value. The perpendicular MTJ stack 1008 also includes a bottom wall 1170 having a bottom magnetic domain 1172, which may be adapted to represent a fourth data value. In a particular example, a data value can be read from the perpendicular MTJ stack 1008 by applying a voltage to the second wire trace 1030 and by comparing a current at the first wire trace 1034 to a reference current. Alternatively, a data value may be written to the perpendicular MTJ stack 1008 by applying a write current between the first and second wire traces 1034 and 1030. In a particular embodiment, the length (a) and the width (b) of the perpendicular MTJ stack 1008 illustrated in FIG. 10 are less than the trench depth (d), and the magnetic domain 1024 carried by the second sidewall 1014 extends in a direction that is substantially parallel to the first surface 1180 of the substrate 1002 and in a direction of the length (a).

Figure 12:
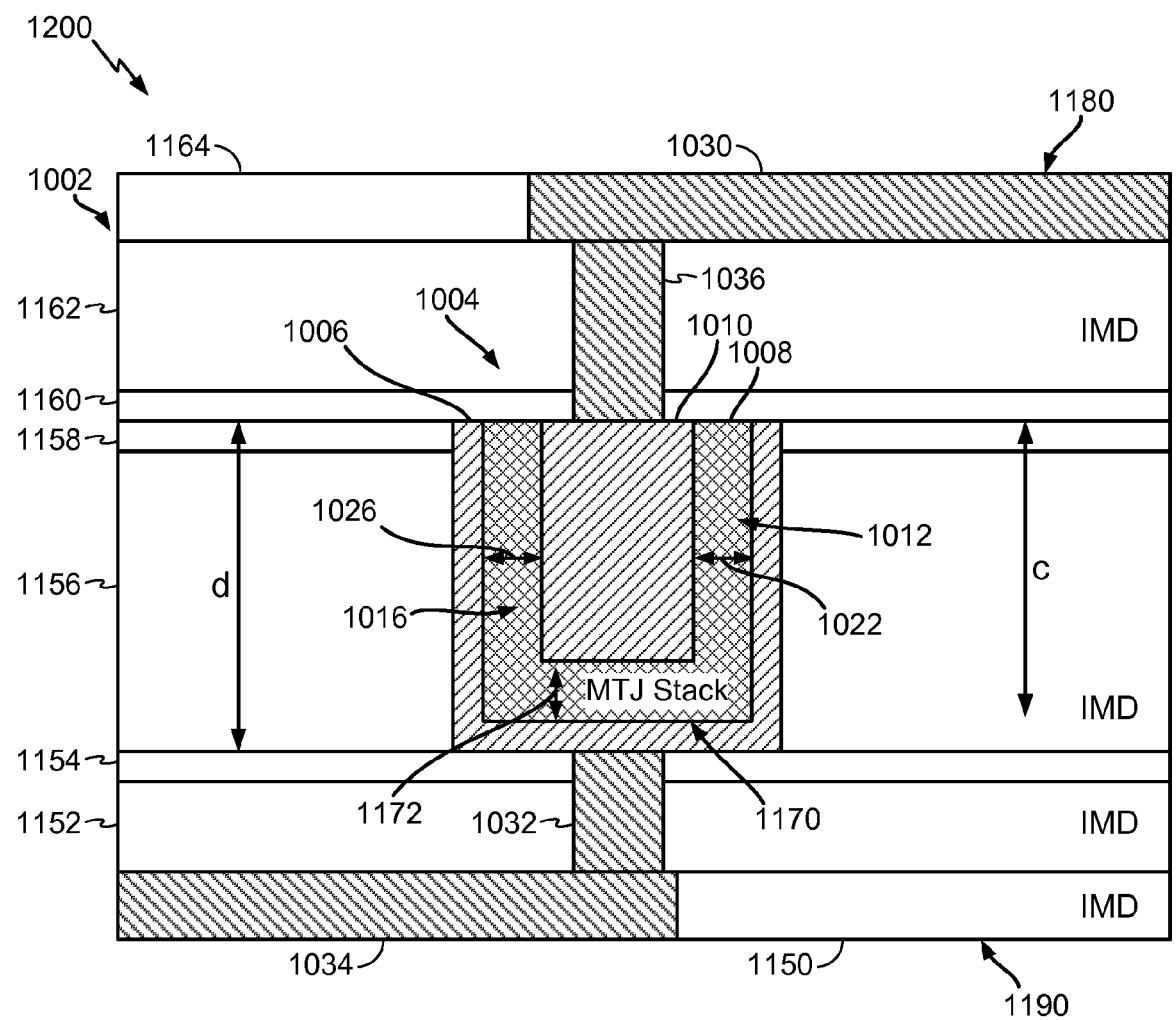
FIG. 12 is a cross-sectional diagram of the memory device of FIG. 10 taken along line 12-12 in FIG. 10.

FIG. 12 is a cross-sectional diagram 1200 of the circuit device 1000 of FIG. 10 taken along line 12-12 in FIG. 10. The diagram 1200 includes the substrate 1002 having a first inter-metal dielectric layer 1150, a second inter-metal dielectric layer 1152, a first cap layer 1154, a third inter-metal dielectric layer 1156, a second cap layer 1158, a third cap layer 1160, a fourth inter-metal dielectric layer 1162, and a fifth inter-metal dielectric layer 1164. The substrate 1002 has a first surface 1180 and a second surface 1190. The substrate 1002 includes the perpendicular MTJ structure 1004 having the bottom electrode 1006, the perpendicular MTJ stack 1008, and the center electrode 1010. The substrate 1002 includes the first wire trace 1034 disposed and patterned at the second surface 1190. The first wire trace 1034 is coupled to the bottom via 1032, which extends from the first wire trace 1034 to a portion of the bottom electrode 1006. The substrate 1002 also includes the second wire trace 1030 at the first surface 1180. The second wire trace 1030 is coupled to the top via 1036, which extends from the second wire trace 1030 to the center electrode 1010.

The perpendicular MTJ stack 1008 includes the first sidewall 1016 to carry the first magnetic domain 1026, the third sidewall 1012 to carry the third magnetic domain 1022, and the bottom wall 1170 to carry the bottom magnetic domain 1172. In this particular view, the trench depth (d) is greater than the length (a) and the width (b) of the perpendicular MTJ stack 1008, the first and third magnetic domains 1022 and 1026 extend in a direction that is substantially horizontal (i.e., in a direction of the length (a) of the sidewalls, as opposed to vertically in a direction of the depth (d) of the sidewalls), and the fourth magnetic domain 1072 extends in a direction that is substantially vertical (i.e., in a direction of the depth (d) of the sidewalls, as opposed to horizontally in a direction of the length (a) of the sidewalls).

In a particular embodiment, the perpendicular MTJ stack 1008 may be adapted to store up to four unique data values. A first data value may be represented by the first magnetic domain 1022, a second data value may be represented by the second magnetic domain 1024, a third data value may be represented by the third magnetic domain 1026, and a fourth data value may be represented by the bottom magnetic domain 1172. In another particular embodiment, a fourth sidewall may be included to carry a fourth magnetic domain, which may represent a fifth data value.

Figure 13:
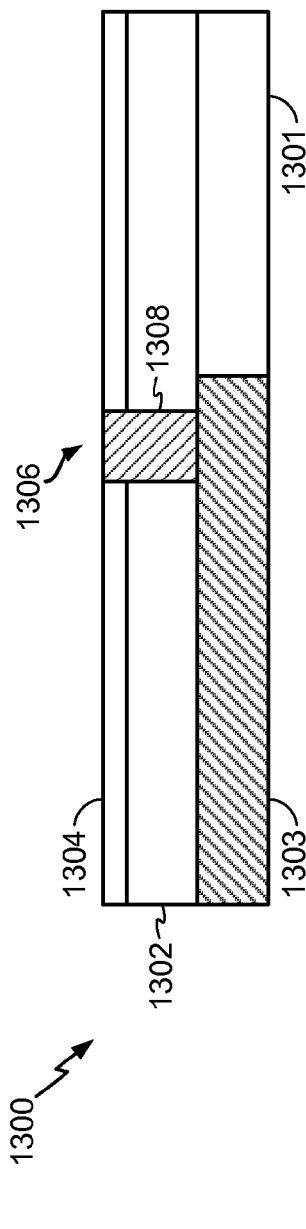
FIG. 13 is a cross-sectional view of circuit substrate after deposition of a cap film layer and after via photo/etching, photo-resist strip, via fill, and via Chemical-Mechanical Planarization (CMP) processes.

FIG. 13 is a cross-sectional view of a circuit substrate 1300 after deposition of a cap film layer and after via photo-etching, photo-resist strip, via fill, and via Chemical-Mechanical Planarization (CMP) processes. The circuit substrate 1300 includes a first inter-metal dielectric layer 1301, and a wire trace 1303, a second inter-metal dielectric layer 1302 disposed on top of the first inter-metal dielectric layer 1301, and a cap film layer 1304 disposed on top of the inter-metal dielectric layer 1302. In a particular embodiment, a photo-resistive layer was applied by spinning photo-resist onto the cap film layer 1304. A photo-etching process was applied to define a trench pattern in the cap layer 1304 and the inter-metal dielectric 1302. The photo-resistive layer was stripped after etching to expose an opening or via 1306 through the cap film layer 1304 and the inter-metal dielectric layer 1302. A conductive material or via fill material 1308 was deposited into the opening 1306, and a via CMP process was performed to planarize the circuit substrate 1300.

Figure 14:
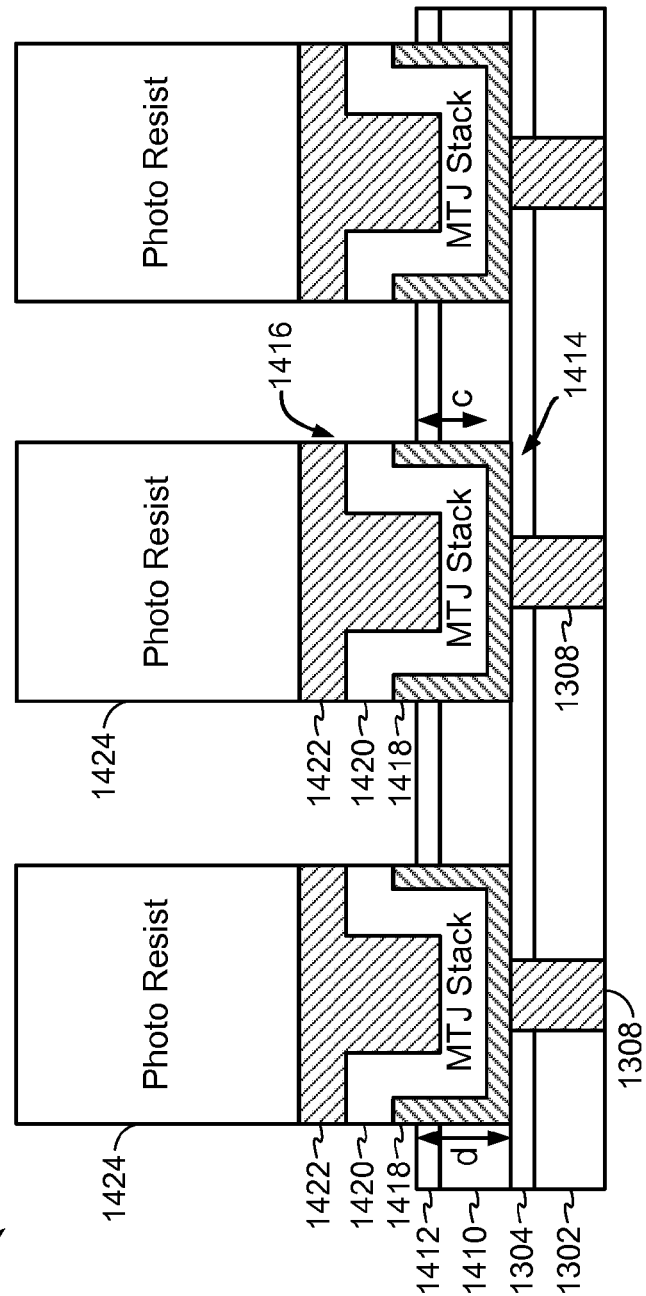
FIG. 14 is a cross-sectional view of the circuit substrate of FIG. 13 illustrating multiple trenches and multiple perpendicular MTJ structures after inter-metal dielectric layer (IMD) deposition, cap film deposition, trench photo/etch process, bottom electrode deposit, magnetic tunnel junction (MTJ) films deposition, top electrode deposit, and reverse photo/etch processing.

FIG. 14 is a cross-sectional view 1400 of the circuit substrate 1300 of FIG. 13 illustrating multiple trenches and multiple perpendicular MTJ structures after inter-metal dielectric layer deposition, cap film deposition, trench photo-etch process, trench photo resist strip, bottom electrode deposit, perpendicular magnetic tunnel junction (MTJ) films deposit, top electrode deposit, and reverse photo-etch processing. The circuit substrate 1300 includes the second inter-metal dielectric layer 1302, the cap film layer 1304, and the via fill material 1308. A third inter-metal dielectric layer 1410 is deposited onto the cap film layer 1304. A second cap film layer 1412 is deposited onto the third inter-metal dielectric layer 1410. A trench 1414 is defined within the cap film layer 1412 and the third inter-metal dielectric layer 1410, for example by performing a trench photo-etch and cleaning process. A perpendicular magnetic tunnel junction (MTJ) cell 1416 is deposited within the trench 1414. The perpendicular MTJ cell 1416 includes a bottom electrode 1418 that is coupled to the bottom via fill material 1308, a perpendicular MTJ stack 1420 coupled to the bottom electrode 1418, and a top electrode 1422 coupled to the perpendicular MTJ stack 1420. A photo-resist layer 1424 is patterned on the top electrode 1422. A reverse photo-etching process is applied to the photo resist layer 1424, the top electrode 1422, the perpendicular MTJ stack 1420, and the bottom electrode 1418 to remove excess material that is not within the trench 1414. As illustrated in FIG. 14, multiple trenches 1414 may be defined within the cap film layer 1412 and the third inter-metal dielectric layer 1410, and a perpendicular MTJ cell 1416 may be deposited in each trench 1414.

In this particular example, the trench 1414 is defined to have a trench depth (d). The thickness of the bottom electrode 1418 is defined to have a relative perpendicular MTJ cell depth (c). In a particular example, the perpendicular MTJ cell depth (c) is approximately equal to the trench depth (d) minus the thickness of the bottom electrode 1418.

In general, by fabricating the perpendicular MTJ cell 1416 within the trench 1414, the dimensions of the trench 1414 define the dimensions of the perpendicular MTJ cell 1416. Further, because the trench 1414 defines the dimensions of the perpendicular MTJ cell 1416, the perpendicular MTJ cell 1416 can be formed without performing a critical and expensive photo-etch process on the perpendicular MTJ cell 1416, thereby reducing oxidation, corner rounding and other erosion-related issues with respect to the perpendicular MTJ cell 1416.

Figure 15:
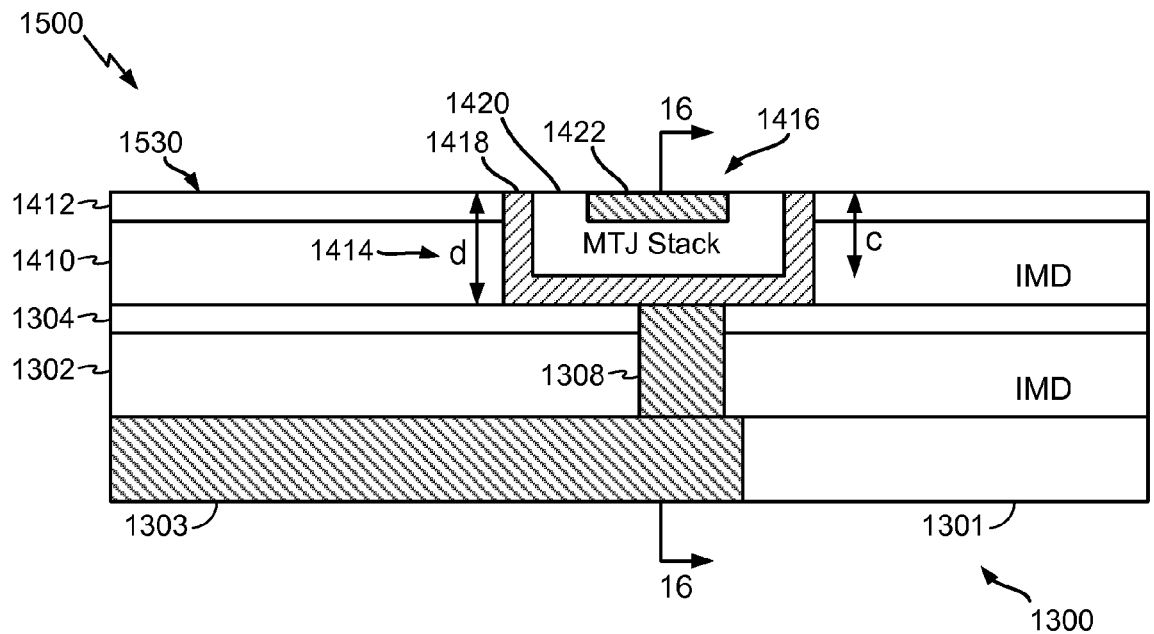
FIG. 15 is a cross-sectional view of the circuit substrate of FIG. 14 after reverse photo-resist strip and MTJ CMP processing to stop at the cap film layer.

FIG. 15 is a cross-sectional view 1500 of the circuit substrate 1300 of FIG. 14 after reverse photo resist strip and MTJ CMP processing to stop at the cap film layer. The circuit substrate 1300 includes the first inter-metal dielectric layer 1301, the wire trace 1303, the second inter-metal dielectric layer 1302, and the first cap layer 1304. The view 1500 includes the second inter-metal dielectric layer 1410, the second cap layer 1412 and the perpendicular MTJ structure 1416. The perpendicular MTJ structure 1416 has a perpendicular MTJ cell depth (d) and is formed within a trench 1414 having a trench depth (d). The perpendicular MTJ structure 1416 includes a bottom electrode 1418 that is coupled to a via fill material 1308, a perpendicular MTJ stack 1420, and a top electrode 1422. A photo resist strip process is applied, and a perpendicular MTJ Chemical-Mechanical Planarization (CMP) process is applied to remove portions of the perpendicular MTJ structure 1416 to produce a substantially planar surface 1530. The CMP process is stopped at the second cap film layer 1412.

Figure 16:
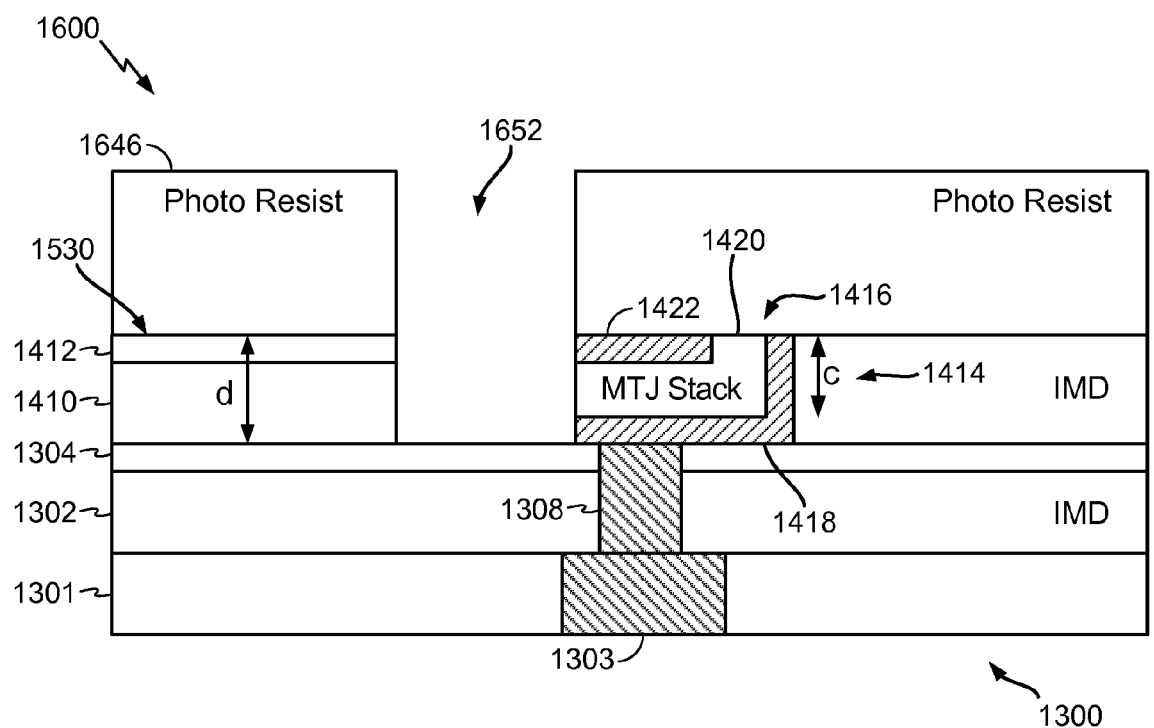
FIG. 16 is a cross-sectional view of the circuit substrate of FIG. 15 taken along line 16-16 in FIG. 15 after spinning on photo resist and after photo-etching to remove a sidewall of the perpendicular MTJ stack providing a process opening.

FIG. 16 is a cross-sectional view 1600 of the circuit substrate 1300 of FIG. 15 taken along line 16-16 in FIG. 15, after photo resist is spun on and patterned, and a perpendicular MTJ sidewall etch is performed. The sidewall etch is an optional process step. The circuit substrate 1300 includes the first inter-metal dielectric layer 1301, the wire trace 1303, the second inter-metal dielectric layer 1302, the first cap film layer 1304, and a via fill material 1308. The third inter-metal dielectric layer 1410 and the second cap layer 1412 are deposited on the second cap layer 1304. A trench 1414 is defined in the second cap layer 1412 and the second inter-metal dielectric layer 1410. The bottom electrode 1418, the perpendicular MTJ stack 1420, and the top electrode 1422 are formed within the trench 1414. A Chemical-Mechanical Planarization (CMP) process is applied to produce a substantially planar surface 1530. A photo resist layer 1646 is spun on and a process pattern opening 1652 is defined using a photo-etch process. The photo-etch process removes a sidewall from the perpendicular MTJ cell 1416, resulting in a substantially u-shaped perpendicular MTJ cell 1416 (from a top view).

Figure 17:
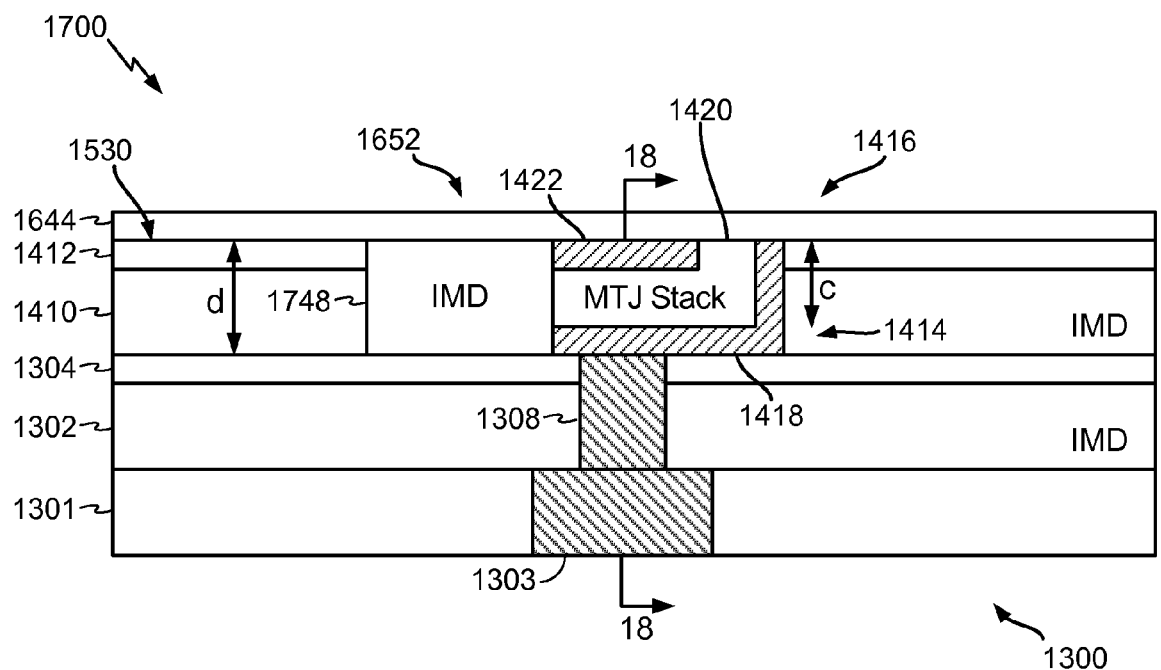
FIG. 17 is a cross-sectional view of the circuit substrate of FIG. 16 after filling the process opening with IMD oxide material and a CMP process stop at the cap layer.

FIG. 17 is a cross-sectional view 1700 of the circuit substrate 1300 illustrated in FIG. 16 after deposition of inter-metal dielectric material within the process opening 1652, after performing a Chemical-Mechanical Planarization (CMP) process, and after depositing a third capping layer 1644. The circuit substrate 1300 includes the first inter-metal dielectric layer 1301, the wire trace 1303, the second inter-metal dielectric layer 1302, the first cap film layer 1304, and a via fill material 1308. The third inter-metal dielectric layer 1410 and the second cap layer 1412 are deposited on the first cap film layer 1304. A trench 1414 is defined in the second cap layer 1412 and the second inter-metal dielectric layer 1410. The bottom electrode 1418, the perpendicular MTJ stack 1420, and the top electrode 1422 are formed within the trench 1414. A Chemical-Mechanical Planarization (CMP) process is applied to restore the substantially planar surface 1530. A process opening 1652 is defined using a photo-etch process. The photo-etch process removes a sidewall from the perpendicular MTJ cell 1416, resulting in a substantially u-shaped perpendicular MTJ cell 1416 (from a top view). The process opening 1652 is filled with an inter-metal dielectric material 1748, a CMP process is performed to restore the substantially planar surface 1530, and the third cap layer 1644 is deposited on the substantially planar surface 1530.

Figure 18:
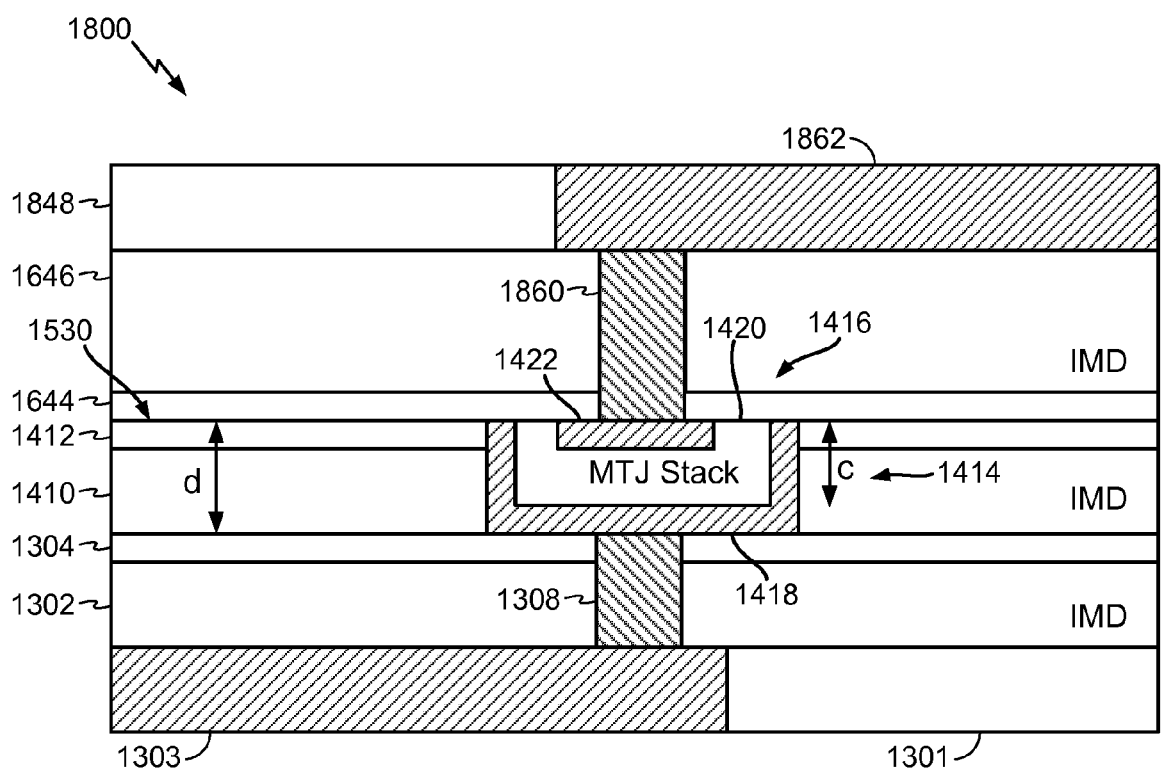
FIG. 18 is a cross-sectional view of the circuit substrate of FIG. 17 taken along the line 18-18 in FIG. 17 after deposition of a first IMD layer, via processing, and metal film deposition and patterning of a top wire trace.

FIG. 18 is a cross-sectional view 1800 of the circuit substrate 1300, which may be coupled to other circuitry. The circuit substrate 1300 includes the first inter-metal dielectric layer 1301, the wire trace 1303, the second inter-metal dielectric layer 1302, the first cap film layer 1304, and a via fill material 1308. The third inter-metal dielectric layer 1410 and the second cap layer 1412 are deposited on the first cap film layer 1304. A trench 1414 is defined in the second cap layer 1412 and the second inter-metal dielectric layer 1410. The bottom electrode 1418, the perpendicular MTJ stack 1420, and the top electrode 1422 are formed within the trench 1414. A Chemical-Mechanical Planarization (CMP) process is applied to restore the substantially planar surface 1530. A third cap layer 1644 and a fourth inter-metal dielectric layer 1646 are deposited. A photo-etch process is applied to define a via 1860 through the fourth inter-metal dielectric layer 1646 and the third cap layer 1644. The via 1860 is filled with conductive material and a via chemical-mechanical planarization process is applied. A metal wire trace 1862 is deposited and patterned on the fourth inter-metal dielectric layer 1646 and a fifth inter-metal dielectric layer 1848 is deposited. If a Damascene process is used, the via and metal wire can be combined into trench patterning, copper plating, and copper CMP in the fifth inter-metal dielectric layer 1848 and the fourth inter-metal dielectric layer 1646. In a particular embodiment, another chemical-mechanical planarization process may be performed to planarize the circuit device. At this stage, the wire trace 1303 and the wire trace 1862 may be coupled to other circuitry, and the perpendicular MTJ cell 1416 may be used to store one or more data values.

Figure 19:
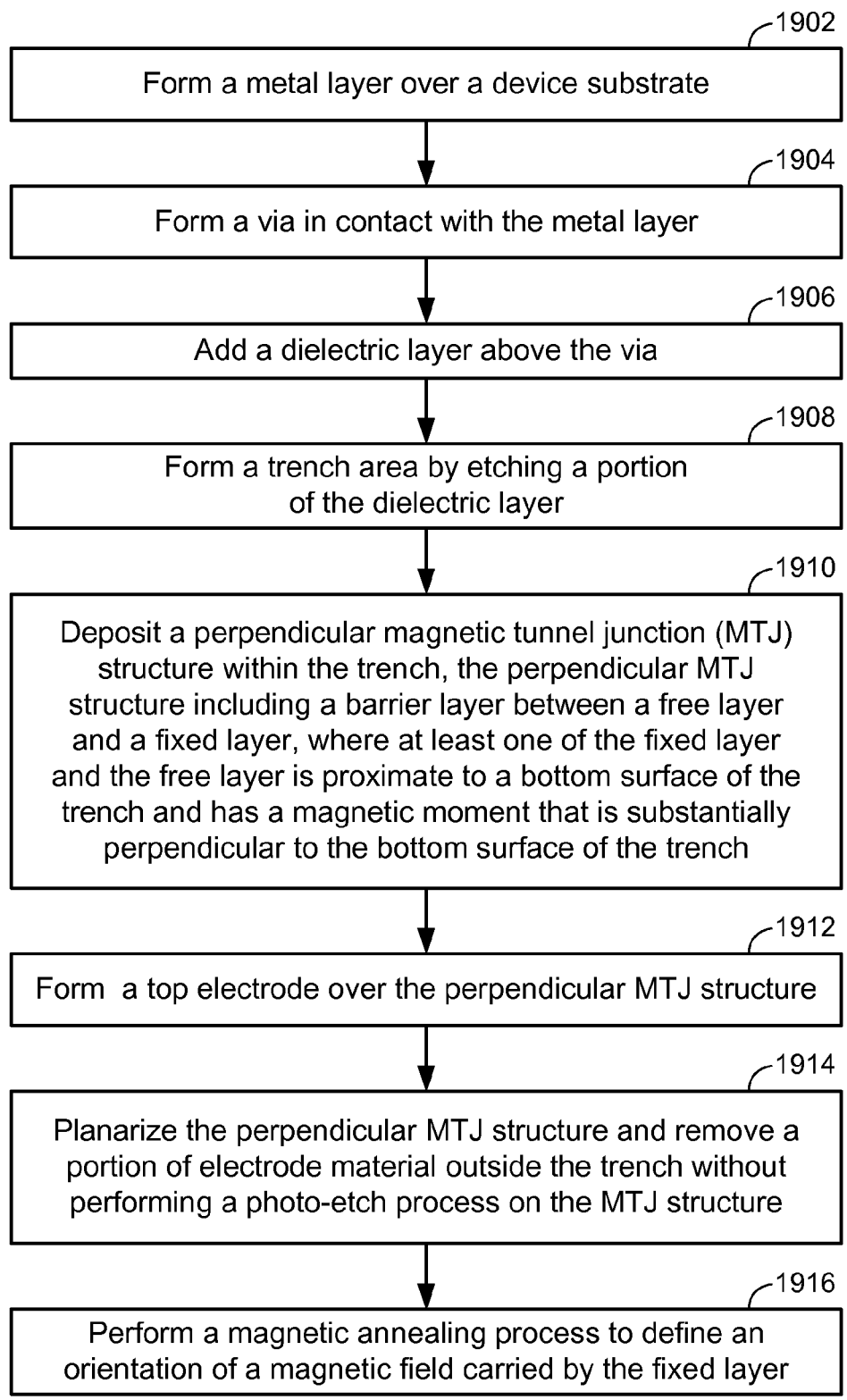
FIG. 19 is a flow diagram of a particular illustrative embodiment of a method of forming a perpendicular magnetic tunnel junction (MTJ) cell.

FIG. 19 is a flow diagram of a particular illustrative embodiment of a method of forming a perpendicular magnetic tunnel junction (MTJ) cell, such as the perpendicular MTJ cell 150 of FIG. 1. At 1902, a metal layer, such as the wire trace 103 of FIG. 1, is formed over a device substrate, such as the device substrate 105 of FIG. 1. Advancing to 1904, a via is formed and is in contact with the metal layer. In a particular embodiment, the via may be formed using a photo-etch process, a photo-resist strip process, and a cleaning process and is filled with conductive material, such as conductive material 108 of FIG. 1. Moving to 1906, a dielectric layer, such as the second dielectric layer 336 of FIG. 3, is added above the via. Continuing to 1908, a trench area, such as the trench 114 of FIG. 1, is formed by etching a portion of the dielectric layer. Proceeding to 1910, after forming the trench area, a perpendicular magnetic tunnel junction (MTJ) structure is deposited into the trench area, such as the perpendicular MTJ stack 152 of FIG. 1. The perpendicular MTJ structure may include a barrier layer, such as the barrier layer 156 of FIG. 1, between a free layer, such as the free layer 154 of FIG. 1, and a fixed layer, such as the fixed layer 158 of FIG. 1. In a particular embodiment, at least one of the fixed layer and the free layer is proximate to a bottom surface of the trench and has a magnetic moment that is substantially perpendicular to the bottom surface of the trench. The perpendicular MTJ structure may further include a reference layer proximate to the bottom surface of the trench having a magnetic moment that is substantially perpendicular to the bottom surface of the trench, such as the reference layer 178 of FIG. 1. Advancing to 1912, a top electrode is formed over the perpendicular MTJ structure, such as the top electrode 170 of FIG. 1

Moving to 1914, the perpendicular MTJ structure may be planarized. The planarization may be performed without performing a photo-etch process on the perpendicular MTJ structure. The planarization process may include performing a Chemical-Mechanical Planarization (CMP) process to remove excess material including a portion of electrode material outside the trench. In a particular embodiment, planarizing the perpendicular MTJ structure may comprise eliminating deposited material from the substrate to define a substantially planar surface.

Continuing to 1916, a magnetic annealing process may be performed to define an orientation of a magnetic field carried by the fixed layer, such as the magnetic domain 109 of FIG. 1. The magnetic annealing process may be a three-dimensional (3D) annealing process. All perpendicular MTJ layers may be annealed via the magnetic annealing process, pinning the fixed layer while allowing the free layer to be modifiable via a write current.

In a particular embodiment, multiple trenches may be formed and depositing the perpendicular MTJ structure is performed by forming MTJ layers into each of the multiple trenches, such as illustrated in FIG. 14. The planarizing may be performed by a CMP process to remove excess material outside each of the multiple trenches to form multiple substantially similar MTJ devices without etching the MTJ layers of the MTJ structures.

Figure 20:
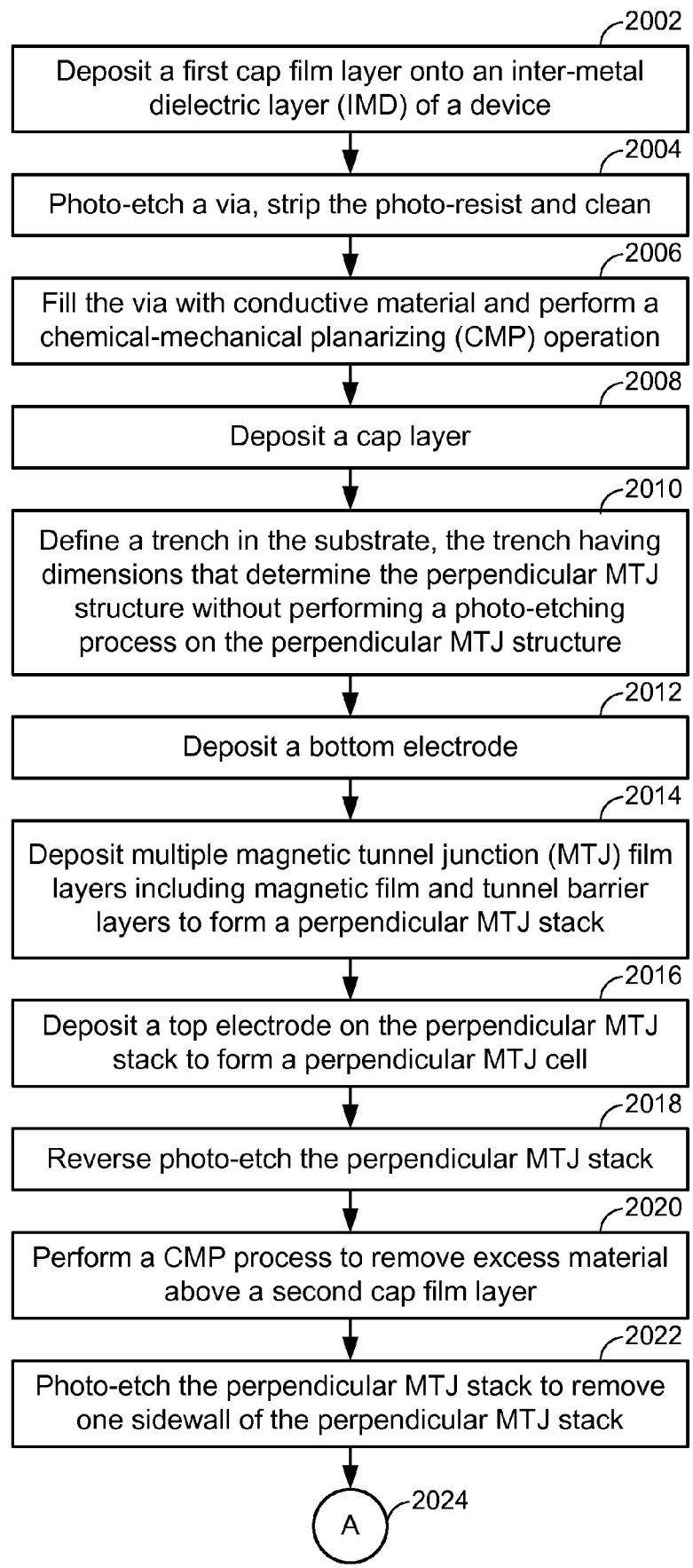
FIGS. 20-21 illustrate a flow diagram of a second particular illustrative embodiment of a method of forming a perpendicular magnetic tunnel junction (MTJ) cell.

FIG. 20 is a flow diagram of a second particular illustrative embodiment of a method of forming a perpendicular magnetic tunnel junction (MTJ) cell. At 2002, a cap film layer, such as the cap film layer 1304 of FIG. 14, is deposited onto an inter-metal dielectric layer (IMD) of a device, such as the second IMD layer 1302 of FIG. 14. Advancing to 2004, a via is formed using a photo-etch process, a photo-resist strip process, and a cleaning process. Continuing to 2006, the via or opening is filled with conductive material, such as the conductive material 1308 of FIG. 14, and a Chemical-Mechanical Planarization (CMP) process is performed to remove excess conductive material. Moving to 2008, a cap layer is deposited over the via, such as the second cap layer 1412 of FIG. 14. Continuing to 2010, a trench is defined having dimensions that determine the perpendicular MTJ structure without performing a photo-etching process on the perpendicular MTJ structure, such as the trench 1414 of FIG. 14. Proceeding to 2012, a bottom electrode is deposited, such as the bottom electrode 1418 of FIG. 14. Continuing to 2014, multiple perpendicular magnetic tunnel junction (MTJ) film layers are deposited, including magnetic film and tunnel barrier layers, to form a perpendicular magnetic tunnel junction (MTJ) stack, such as perpendicular MTJ stack 1420 of FIG. 14. Continuing to 2016, a top electrode is deposited on the perpendicular MTJ stack to form a perpendicular MTJ cell, such as the top electrode 1422 of FIG. 14. Advancing to 2018, a reverse photo-etch process is performed to remove excess material that is not directly over the trench. At 2020, a CMP process is performed to remove excess material above a second cap layer. Proceeding to 2022, the perpendicular MTJ stack is photo-etched to remove one sidewall of the perpendicular MTJ stack. In a particular embodiment, the photo-etching of the perpendicular MTJ stack defines a process window or opening. The method advances to 2024.

Figure 21:
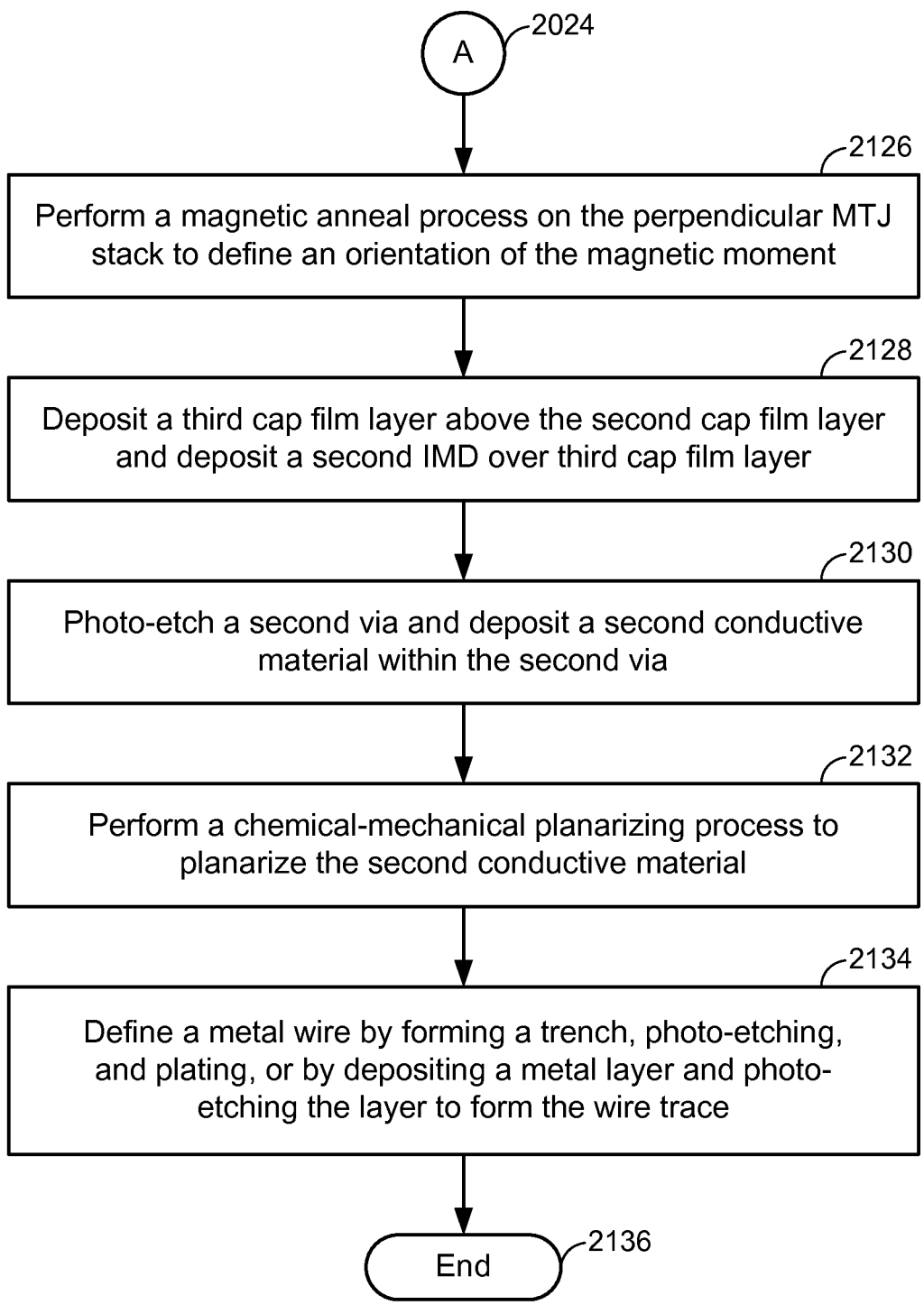

Turning to FIG. 21, at 2024, the method advances to 2126 and a magnetic anneal process is performed on the perpendicular MTJ stack to define an orientation of the magnetic moment. Moving to 2128, a third cap film layer, such as third cap layer 1644 of FIG. 18, is deposited above the second cap film layer, and a second IMD, such as the fourth IMD layer 1646 of FIG. 18, is deposited over the third cap film layer. Proceeding to 2130, a second via, such as the via 1860 of FIG. 18, is formed using a photo-etch process and the second via or opening is filled with conductive material. Advancing to 2132, a CMP process is performed to planarize the conductive material. Continuing to 2134, a metal wire may be defined by depositing a metal layer and photo-etching the layer to form the wire trace or by forming a trench, photo-etching, plating and performing a Chemical-Mechanical Planarization (CMP) process. If a Damascene process is used, the via processing at 2132 and the metal wire processing at 2134 can be combined as trench photo/etch defined, photo resist strip, copper plating, and copper CMP process. The method terminates at 2136.

Figure 22:
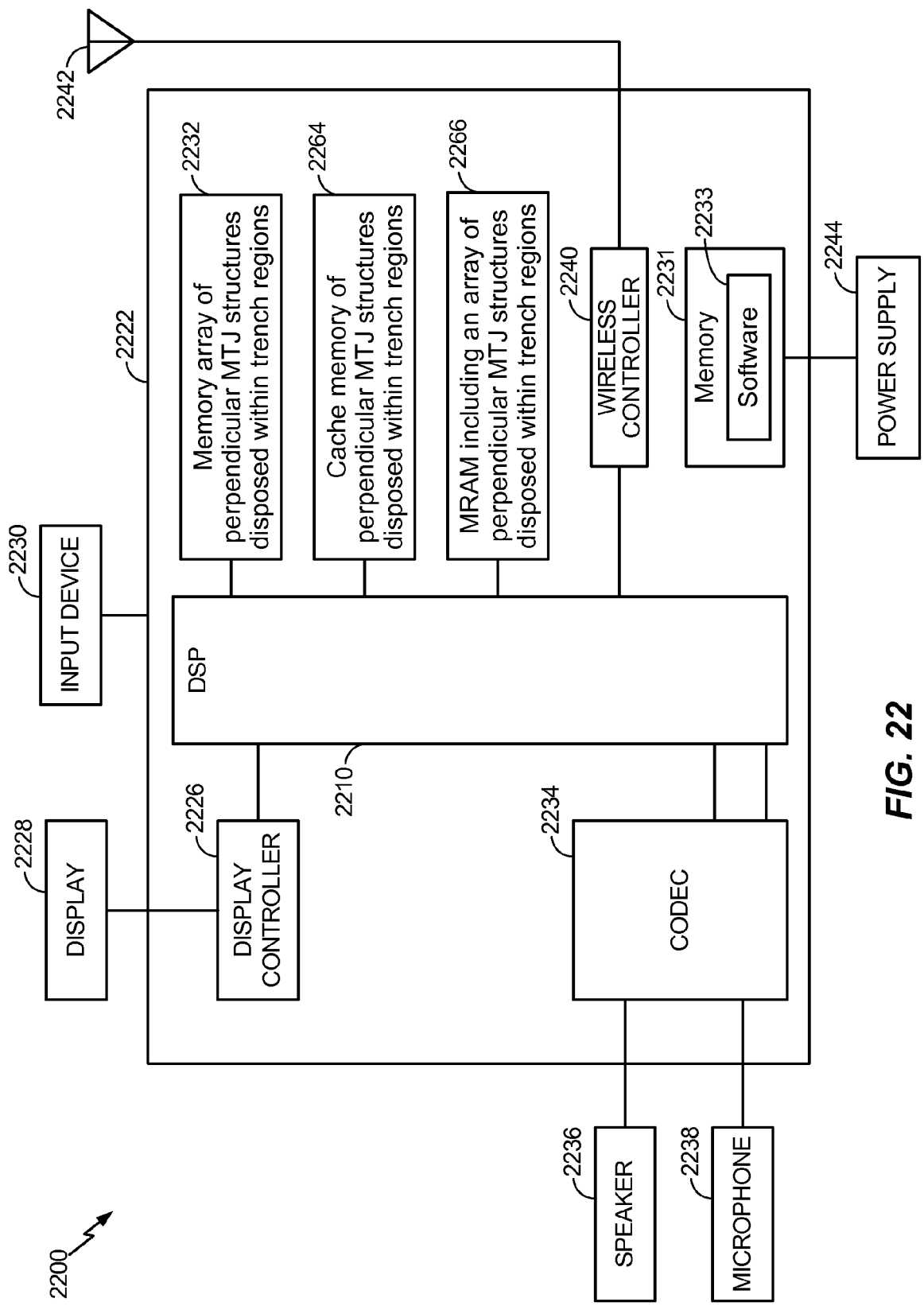
FIG. 22 is a block diagram of a representative wireless communications device including a memory device having a plurality of perpendicular MTJ cells.

FIG. 22 is a block diagram of a representative wireless communications device 2200 including a memory device having a plurality of perpendicular MTJ structures. The communications device 2200 includes a memory array of perpendicular MTJ structures disposed within trench regions 2232 and a magneto-resistive random access memory (MRAM) including an array of perpendicular MTJ structures disposed within trench regions 2266, which are coupled to a processor, such as a digital signal processor (DSP) 2210. The DSP 2210 is coupled to a computer readable medium, such as memory 2231, storing computer readable instructions, such as software 2233. The communications device 2200 also includes a cache memory device of perpendicular MTJ structures disposed within a trench region 2264 that is coupled to the DSP 2210. The cache memory device of perpendicular MTJ structures disposed within trench regions 2264, the memory array of perpendicular MTJ structures disposed within trench regions 2232 and the MRAM device including multiple perpendicular MTJ structures disposed within trench regions 2266 may include perpendicular MTJ cells formed according to a process, as described with respect to FIGS. 3-21.

FIG. 22 also shows a display controller 2226 that is coupled to the digital signal processor 2210 and to a display 2228. A coder/decoder (CODEC) 2234 can also be coupled to the digital signal processor 2210. A speaker 2236 and a microphone 2238 can be coupled to the CODEC 2234.

FIG. 22 also indicates that a wireless controller 2240 can be coupled to the digital signal processor 2210 and to a wireless antenna 2242. In a particular embodiment, an input device 2230 and a power supply 2244 are coupled to the on-chip system 2222. Moreover, in a particular embodiment, as illustrated in FIG. 22, the display 2228, the input device 2230, the speaker 2236, the microphone 2238, the wireless antenna 2242, and the power supply 2244 are external to the on-chip system 2222. However, each can be coupled to a component of the on-chip system 2222, such as an interface or a controller.

The foregoing disclosed devices and functionalities (such as the devices of

Figure 23:
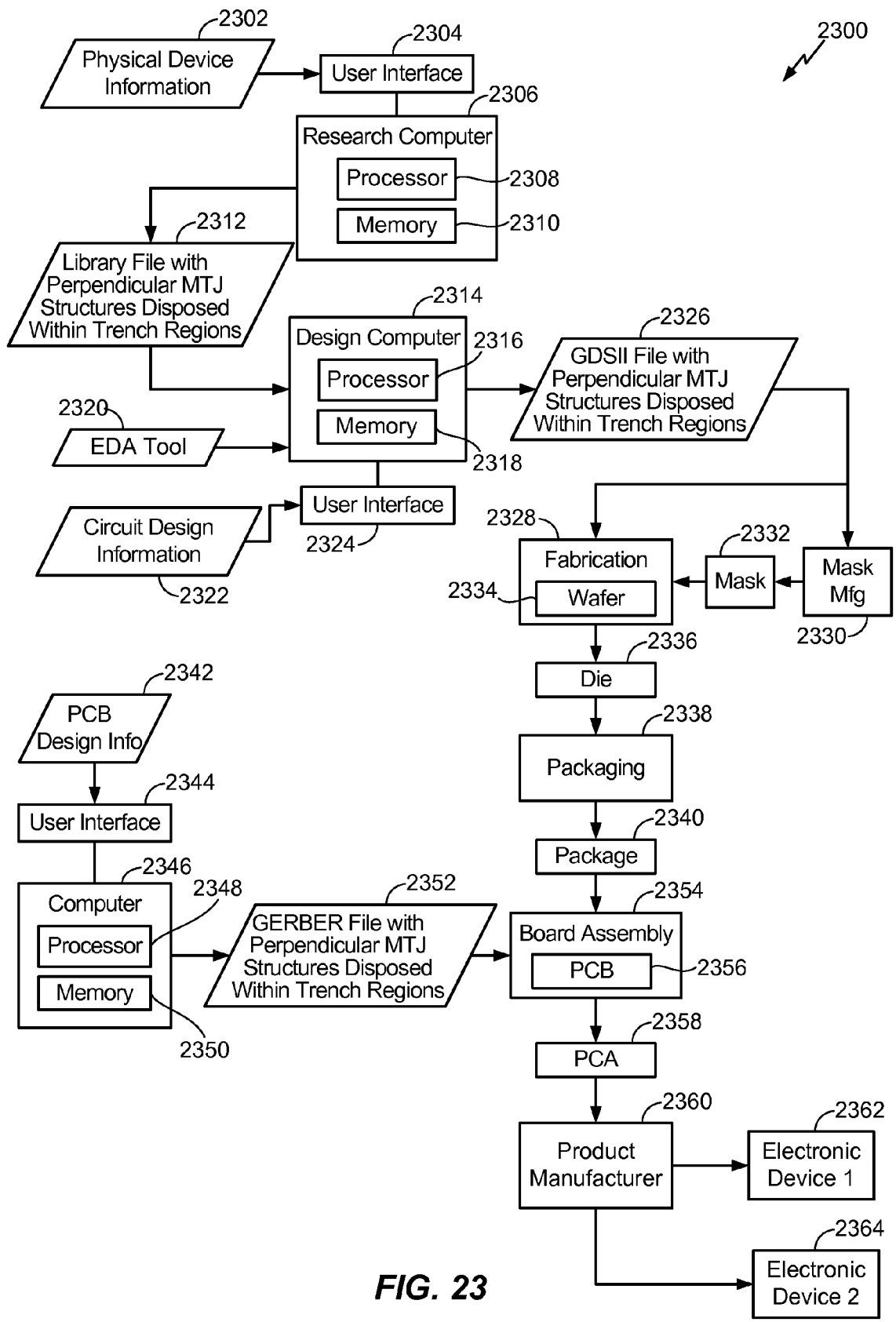
FIG. 23 is a data flow diagram of a particular illustrative embodiment of a manufacturing process to manufacture electronic devices that include a perpendicular MTJ cell.

FIGS. 1-18, the methods of FIGS. 19-21, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 23 depicts a particular illustrative embodiment of an electronic device manufacturing process 2300.

Physical device information 2302 is received in the manufacturing process 2300, such as at a research computer 2306. The physical device information 2302 may include design information representing at least one physical property of a semiconductor device, such as an MTJ device having a perpendicular MTJ structure disposed within a trench region as illustrated in any of FIGS. 1-18 or formed in accordance with any of FIGS. 19-21. For example, the physical device information 2302 may include physical parameters, material characteristics, and structure information that is entered via a user interface 2304 coupled to the research computer 2306. The research computer 2306 includes a processor 2308, such as one or more processing cores, coupled to a computer readable medium such as a memory 2310. The memory 2310 may store computer readable instructions that are executable to cause the processor 2308 to transform the physical device information 2302 to comply with a file format and to generate a library file 2312.

In a particular embodiment, the library file 2312 includes at least one data file including the transformed design information. For example, the library file 2312 may include a library of semiconductor devices including a perpendicular MTJ device having a perpendicular MTJ structure disposed within a trench region as illustrated in any of FIGS. 1-18 or formed in accordance with any of FIGS. 19-21, that is provided for use with an electronic design automation (EDA) tool 2320.

The library file 2312 may be used in conjunction with the EDA tool 2320 at a design computer 2314 including a processor 2316, such as one or more processing cores, coupled to a memory 2318. The EDA tool 2320 may be stored as processor executable instructions at the memory 2318 to enable a user of the design computer 2314 to design a circuit using the perpendicular MTJ device as illustrated in any of FIGS. 1-18 or formed in accordance with any of FIGS. 19-21, of the library file 2312. For example, a user of the design computer 2314 may enter circuit design information 2322 via a user interface 2324 coupled to the design computer 2314. The circuit design information 2322 may include design information representing at least one physical property of a semiconductor device, such as the perpendicular MTJ device having a perpendicular MTJ structure disposed within a trench region as illustrated in any of FIGS. 1-18 or formed in accordance with any of FIGS. 19-21. To illustrate, the circuit design property may include identification of particular circuits and relationships to other elements in a circuit design, positioning information, feature size information, interconnection information, or other information representing a physical property of a semiconductor device.

The design computer 2314 may be configured to transform the design information, including the circuit design information 2322, to comply with a file format. To illustrate, the file formation may include a database binary file format representing planar geometric shapes, text labels, and other information about a circuit layout in a hierarchical format, such as a Graphic Data System (GDSII) file format. The design computer 2314 may be configured to generate a data file including the transformed design information, such as a GDSII file 2326 that includes information describing the perpendicular MTJ device as illustrated in any of FIGS. 1-18 or formed in accordance with any of FIGS. 19-21, in addition to other circuits or information. To illustrate, the data file may include information corresponding to a system-on-chip (SOC) that includes the perpendicular MTJ device having a perpendicular MTJ structure disposed within a trench region as illustrated in any of FIGS. 1-18 or formed in accordance with any of FIGS. 19-21 and that also includes additional electronic circuits and components within the SOC.

The GDSII file 2326 may be received at a fabrication process 2328 to manufacture the perpendicular MTJ device having a perpendicular MTJ structure disposed within a trench region as illustrated in any of FIGS. 1-18 or formed in accordance with any of FIGS. 19-21, according to transformed information in the GDSII file 2326. For example, a device manufacture process may include providing the GDSII file 2326 to a mask manufacturer 2330 to create one or more masks, such as masks to be used for photolithography processing, illustrated as a representative mask 2332. The mask 2332 may be used during the fabrication process to generate one or more wafers 2334, which may be tested and separated into dies, such as a representative die 2336. The die 2336 includes a circuit including the perpendicular MTJ device having a perpendicular MTJ structure disposed within a trench region as illustrated in any of FIGS. 1-18 or formed in accordance with any of FIGS. 19-21.

The die 2336 may be provided to a packaging process 2338 where the die 2336 is incorporated into a representative package 2340. For example, the package 2340 may include the single die 2336 or multiple dies, such as a system-in-package (SiP) arrangement. The package 2340 may be configured to conform to one or more standards or specifications, such as Joint Electron Device Engineering Council (JEDEC) standards.

Information regarding the package 2340 may be distributed to various product designers, such as via a component library stored at a computer 2346. The computer 2346 may include a processor 2348, such as one or more processing cores, coupled to a memory 2350. A printed circuit board (PCB) tool may be stored as processor executable instructions at the memory 2350 to process PCB design information 2342 received from a user of the computer 2346 via a user interface 2344. The PCB design information 2342 may include physical positioning information of a packaged semiconductor device on a circuit board, the packaged semiconductor device corresponding to the package 2340 including the perpendicular MTJ device having a perpendicular MTJ structure disposed within a trench region as illustrated in any of FIGS. 1-18 or formed in accordance with any of FIGS. 19-21.

The computer 2346 may be configured to transform the PCB design information 2342 to generate a data file, such as a GERBER file 2352 with data that includes physical positioning information of a packaged semiconductor device on a circuit board, as well as layout of electrical connections such as traces and vias, where the packaged semiconductor device corresponds to the package 2340 including the perpendicular MTJ device having a perpendicular MTJ structure disposed within a trench region as illustrated in any of FIGS. 1-18 or formed in accordance with any of FIGS. 19-21. In other embodiments, the data file generated by the transformed PCB design information may have a format other than a GERBER format.

The GERBER file 2352 may be received at a board assembly process 2354 and used to create PCBs, such as a representative PCB 2356, manufactured in accordance with the design information stored within the GERBER file 2352. For example, the GERBER file 2352 may be uploaded to one or more machines for performing various steps of a PCB production process. The PCB 2356 may be populated with electronic components including the package 2340 to form a representative printed circuit assembly (PCA) 2358.

The PCA 2358 may be received at a product manufacture process 2360 and integrated into one or more electronic devices, such as a first representative electronic device 2362 and a second representative electronic device 2364. As an illustrative, non-limiting example, the first representative electronic device 2362, the second representative electronic device 2364, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 2362 and 2364 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 23 illustrates remote units according to teachings of the disclosure, the disclosure is not limited to these exemplary illustrated units. Embodiments of the disclosure may be suitably employed in any device that includes active integrated circuitry including memory and on-chip circuitry.

Thus, perpendicular MTJ devices having a perpendicular MTJ structure disposed within a trench region as illustrated in any of FIGS. 1-18 or formed in accordance with any of FIGS. 19-21, may be fabricated, processed, and incorporated into an electronic device, as described in the illustrative process 2300. One or more aspects of the embodiments disclosed with respect to FIGS. 1-22 may be included at various processing stages, such as within the library file 2312, the GDSII file 2326, and the GERBER file 2352, as well as stored at the memory 2310 of the research computer 2306, the memory 2318 of the design computer 2314, the memory 2350 of the computer 2346, the memory of one or more other computers or processors (not shown) used at the various stages, such as at the board assembly process 2354, and also incorporated into one or more other physical embodiments such as the mask 2332, the die 2336, the package 2340, the PCA 2358, other products such as prototype circuits or devices (not shown), or any combination thereof. For example, the GDSII file 2326 or the fabrication process 2328 can include a computer readable tangible medium storing instructions executable by a computer, a controller of a material deposition system, or other electronic device, the instructions including instructions that are executable by a processor of the computer or controller to initiate formation of a perpendicular MTJ device having a perpendicular MTJ structure disposed within a trench region as illustrated in any of FIGS. 1-18 or formed in accordance with any of FIGS. 19-21. For example, the instructions may include instructions that are executable by a computer, such as at the fabrication stage 2328, to initiate forming a metal layer over a device substrate, forming a via in contact with the metal layer, adding a dielectric layer above the via, etching a portion of the dielectric layer to form a trench area, and depositing a perpendicular magnetic tunnel junction (MTJ) structure into the trench area. Although various representative stages of production from a physical device design to a final product are depicted, in other embodiments fewer stages may be used or additional stages may be included. Similarly, the process 2300 may be performed by a single entity, or by one or more entities performing various stages of the process 2300.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    fabricating a semiconductor device by:
        forming a metal layer over a device substrate;
        forming a via in contact with the metal layer;
        adding a dielectric layer above the via;
        etching a portion of the dielectric layer to form a trench area;
        depositing a perpendicular magnetic tunnel junction (MTJ) structure into the trench area, the perpendicular MTJ structure comprising a free layer and a fixed layer, wherein at least a first portion of one of the fixed layer and the free layer at a center of a bottom of the trench area has a first magnetic moment that is substantially perpendicular to the bottom of the trench area; and
        forming an electrode over the perpendicular MTJ structure and within the trench area.

2. The method of claim 1, wherein the perpendicular MTJ structure is formed without using an MTJ photo-etch process.

3. The method of claim 1, further comprising performing a magnetic annealing process to define an orientation of a magnetic field carried by the fixed layer.

4. The method of claim 1, further comprising removing a portion of electrode material outside the trench area.

5. The method of claim 1, wherein forming the metal layer, forming the via, adding the dielectric layer, etching the portion of the dielectric layer, and depositing the perpendicular MTJ structure are performed in response to a processor integrated into an electronic device.

6. The method of claim 1, wherein at least a portion of the trench area comprises a substantially curved shape.

7. The method of claim 1, wherein a shape of the perpendicular MTJ structure is defined by the trench area without etching the perpendicular MTJ structure.

8. The method of claim 1, wherein the perpendicular MTJ structure comprises at least one of iron/platinum, cobalt/platinum, or cobalt/nickel.

9. The method of claim 1, wherein the semiconductor device is integrated into a spin torque tunnel magneto-resistive random access memory (STT-MRAM) device.

10. The method of claim 1, wherein the free layer of the perpendicular MTJ structure concurrently carries multiple magnetic moments, and wherein at least two magnetic moments between the electrode and sidewalls of the trench area are substantially perpendicular to the sidewalls.

11. The method of claim 1, wherein the perpendicular MTJ structure includes a cap layer deposited on the free layer.

12. The method of claim 1, further comprising performing a photo/etch to remove a portion of the perpendicular MTJ structure along a sidewall of the trench area.

13. The method of claim 1, wherein the semiconductor device is integrated into one of a set top box, a music player, a video player, an entertainment unit, a navigation device, a communications device, a personal digital assistant (PDA), a fixed location data unit, or a computer.

14. The method of claim 1, wherein planarizing the perpendicular MTJ structure removes a portion of the perpendicular MTJ structure and removes a portion of the electrode.

15. The method of claim 1, further comprising planarizing the perpendicular MTJ structure.

16. The method of claim 15, wherein the planarizing is performed without performing a photo-etch process on the perpendicular MTJ structure.

17. The method of claim 15, further comprising forming multiple trenches, wherein depositing perpendicular MTJ structures is performed by forming MTJ layers into each of the multiple trenches, and wherein planarizing is performed by a Chemical-Mechanical Planarization (CMP) process to remove excess material outside each of the multiple trenches to form multiple substantially similar MTJ devices without etching the MTJ layers of the perpendicular MTJ structures.

18. The method of claim 15, wherein planarizing the perpendicular MTJ structure comprises eliminating deposited material from the substrate to define a substantially planar surface.

19. The method of claim 18, wherein planarizing the perpendicular MTJ structure comprises performing a Chemical-Mechanical Planarization (CMP) process to remove excess material.

20. The method of claim 18, wherein the substantially planar surface includes a first surface of the electrode and a second surface of the perpendicular MTJ structure.

21. The method of claim 1, wherein the perpendicular MTJ structure comprises a barrier layer between the free layer and the fixed layer, wherein at least a second portion of one of the fixed layer and the free layer is proximate to a side of the trench area and has a second magnetic moment that is substantially perpendicular to the side of the trench area.

22. The method of claim 21, wherein the perpendicular MTJ structure comprises a cap layer over the free layer.

23. The method of claim 21, wherein the perpendicular MTJ structure comprises a reference layer proximate to the bottom of the trench area and having a magnetic moment that is substantially perpendicular to the bottom of the trench area.

24. The method of claim 23, wherein the reference layer comprises platinum.

25. The method of claim 1, further comprising:
depositing a first cap film layer onto a first inter-metal dielectric layer (IMD) layer, wherein the first IMD layer is positioned above the metal layer; and
performing a photo/etch/photo-resist strip process on the first cap film layer and the first IMD layer to define the via.

26. The method of claim 25, further comprising:
depositing a second cap film layer onto a second IMD layer, wherein the second IMD layer is positioned above the second cap film layer;
performing a reverse photo/etch process to remove material extending beyond the trench area; and
performing a Chemical-Mechanical Planarization (CMP) process to remove material above the second cap film layer.

27. The method of claim 1, further comprising, after forming the electrode, performing a planarization operation, wherein the planarization operation planarizes the electrode and a bottom electrode.

28. The method of claim 27, wherein the planarization operation further planarizes the perpendicular MTJ structure.

29. The method of claim 1, further comprising forming a layer of the perpendicular MTJ structure, wherein the layer is in contact with the first portion of one of the fixed layer and the free layer and a bottom electrode, the bottom electrode in contact with the via.

30. The method of claim 29, wherein the layer comprises a reference layer of the perpendicular MTJ structure.

31. A method of fabricating a semiconductor device, the method comprising:
depositing a first cap film layer onto an inter-metal dielectric (IMD) layer of a device;
performing a photo/etch/photo-resist strip process on the first cap film layer and the IMD layer to define a via;
depositing a first conductive material within the via;
performing a first Chemical-Mechanical Planarization (CMP) process to planarize the first conductive material;
defining a trench in the device, the trench having dimensions that determine a shape of a magnetic tunnel junction (MTJ) structure without performing a photo-etching process on the MTJ structure;
depositing a second conductive material to form a bottom electrode in the trench;
forming a perpendicular MTJ stack on the bottom electrode, the perpendicular MTJ stack including a magnetic film having a portion at a center of a bottom of the trench, the portion of the magnetic film having a magnetic moment substantially perpendicular to the bottom of the trench, the perpendicular MTJ stack also comprising a tunnel barrier layer;
depositing a third conductive material to form a top electrode;
performing a reverse photo/etch process to remove material extending beyond the trench;
performing a second CMP process to remove material above a second cap film layer;
depositing a third cap film layer above the second cap film layer;
performing a magnetic annealing process to define an orientation of the magnetic moment;
depositing a second IMD layer over the third cap film layer;
performing photo/etch on the third cap film layer and the second IMD layer to define a second via;
depositing the second conductive material within the second via;
performing a third CMP process to planarize the second conductive material; and
depositing a metal layer over the second via.

32. The method of claim 31, further comprising performing a photo/etch to remove a portion of the perpendicular MTJ stack along a sidewall of the trench.

33. The method of claim 31, wherein the magnetic film comprises at least one of a fixed layer or a free layer.

34. The method of claim 31, wherein the magnetic film comprises a fixed layer and a free layer.

35. The method of claim 31, wherein the perpendicular MTJ stack includes a cap layer, a free layer, a barrier layer, a pinned layer, and a reference layer.

36. A method of fabricating a semiconductor device, the method comprising:
forming a metal layer over a device substrate;
forming a via in contact with the metal layer;
adding a dielectric layer above the via;
etching a portion of the dielectric layer to form a trench area;
depositing a perpendicular magnetic tunnel junction (MTJ) structure into the trench area, the perpendicular MTJ structure comprising a free layer and a fixed layer, wherein at least a first portion of one of the fixed layer and the free layer is proximate to a bottom surface of the trench area and has a first magnetic moment that is substantially perpendicular to the bottom surface of the trench area; and
performing a photo/etch to remove a portion of the perpendicular MTJ structure to create an opening and depositing a dielectric material within the opening.

37. The method of claim 36, wherein the trench area comprises one of a substantially U-shaped cross section, a substantially L-shaped cross section, or a substantially rectangular cross section.

38. The method of claim 36, wherein at least a portion of the trench area has a substantially curved shape.

39. An apparatus comprising:
a processor; and
a memory storing instructions executable by the processor to cause the processor to perform operations comprising:
initiating forming of a metal layer over a device substrate;
initiating forming of a via in contact with the metal layer;
initiating adding of a dielectric layer above the via;
initiating etching of a portion of the dielectric layer to form a trench area;
initiating depositing of a perpendicular magnetic tunnel junction (MTJ) structure into the trench area, the perpendicular MTJ structure comprising a free layer and a fixed layer, wherein at least a first portion of one of the fixed layer and the free layer at a center of a bottom of the trench area has a first magnetic moment that is substantially perpendicular to the bottom of the trench area; and
initiating forming of an electrode over the perpendicular MTJ structure and within the trench area.

40. The apparatus of claim 39, wherein the operations include initiating performing a photo/etch to remove a portion of the perpendicular MTJ structure along a sidewall of the trench area.

41. An apparatus comprising:
means for forming a metal layer over a device substrate;
means for forming a via in contact with the metal layer;
means for adding a dielectric layer above the via;

means for etching a portion of the dielectric layer to form a trench area;

means for depositing a perpendicular magnetic tunnel junction (MTJ) structure into the trench area, the perpendicular MTJ structure comprising a free layer and a fixed layer, wherein at least a first portion of one of the fixed layer and the free layer at a center of a bottom of the trench area has a first magnetic moment that is substantially perpendicular to the bottom of the trench area; and means for forming an electrode over the perpendicular MTJ structure and within the trench area.

42. The apparatus of claim 41, further comprising means for performing a photo/etch to remove a portion of the perpendicular MTJ structure along a sidewall of the trench area.

43. A computer-readable storage device storing instructions that, when executed by the computer, cause the computer to perform operations comprising:

initiating forming of a metal layer over a device substrate;
initiating forming of a via in contact with the metal layer;
initiating adding of a dielectric layer above the via;
initiating etching of a portion of the dielectric layer to form a trench area;
initiating depositing of a perpendicular magnetic tunnel junction (MTJ) structure into the trench area, the perpendicular MTJ structure comprising a free layer and a fixed layer, wherein at least a first portion of one of the fixed layer and the free layer at a center of a bottom of the trench area has a first magnetic moment that is substantially perpendicular to the bottom of the trench area; and
initiating forming of an electrode over the perpendicular MTJ structure and within the trench area.

44. The computer-readable storage device of claim 43, further comprising instructions that cause the computer to perform operations comprising initiating performing a photo/etch to remove a portion of the perpendicular MTJ structure along a sidewall of the trench area.

* * * * *